(12) United States Patent
Hiraishi et al.

(10) Patent No.: US 6,455,347 B1
(45) Date of Patent: Sep. 24, 2002

(54) METHOD OF FABRICATING THIN-FILM PHOTOVOLTAIC MODULE

(75) Inventors: Masafumi Hiraishi; Katsuhiko Hayashi, both of Shiga; Hideo Yamagishi, Kyoto, all of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/525,494

(22) Filed: Mar. 15, 2000

(30) Foreign Application Priority Data

| Jun. 14, 1999 | (JP) | 11-166673 |
| Aug. 25, 1999 | (JP) | 11-238707 |
| Sep. 16, 1999 | (JP) | 11-262216 |
| Oct. 13, 1999 | (JP) | 11-291229 |
| Nov. 2, 1999 | (JP) | 11-312400 |

(51) Int. Cl.⁷ .................. H01L 31/18; H01L 31/042
(52) U.S. Cl. ............... 438/80; 136/244; 136/249; 438/98; 438/73; 438/57
(58) Field of Search ................ 136/244, 249; 438/80, 98, 73, 57

(56) References Cited

U.S. PATENT DOCUMENTS

| 4,292,092 | A | * | 9/1981 | Hanak ........................... 438/74 |
| 4,668,840 | A | * | 5/1987 | Kiyama et al. ............. 136/244 |
| 4,755,475 | A | * | 7/1988 | Kiyama et al. ............... 438/80 |
| 5,798,284 | A | * | 8/1998 | Nakagawa ..................... 438/80 |
| 6,080,928 | A | * | 6/2000 | Nakagawa ................... 136/249 |
| 6,271,053 | B1 | * | 8/2001 | Kondo ........................... 438/57 |
| 6,300,556 | B1 | * | 10/2001 | Yamagishi et al. ......... 136/251 |

* cited by examiner

*Primary Examiner*—Alan Diamond
(74) *Attorney, Agent, or Firm*—Hogan & Hartson, LLP

(57) ABSTRACT

This invention provides a method of fabricating a thin-film photovoltaic module having a structure in which a plurality of thin films are stacked. This method includes postulating a substrate temperature during laser scribing for each thin film, determining a scanning pattern by taking account of the size of the substrate at the postulated temperature, and dividing each thin film in accordance with the scanning pattern while keeping the substrate temperature at the postulated temperature or a temperature in its neighborhood.

19 Claims, 6 Drawing Sheets

METHOD OF FABRICATING THIN-FILM PHOTOVOLTAIC MODULE

CROSS-REFERENCE TO RELATED APPLICATIONS

This application is based upon and claims the benefit of priority from the prior Japanese Patent Applications No. 11-166673, filed Jun. 14, 1999; No. 11-238707, filed Aug. 25, 1999; No. 11-262216, filed Sep. 16, 1999; No. 11-291229, filed Oct. 13, 1999; and No. 11-312400, filed Nov. 2, 1999, the entire contents of which are incorporated herein by reference.

BACKGROUND OF THE INVENTION

The present invention relates to a method of fabricating a thin-film photovoltaic module and, more particularly, to a method of fabricating a thin-film photovoltaic module by which a thin film is divided by laser scribing.

Generally, a thin-film photovoltaic module has a structure in which strip-like thin-film photovoltaic cells are formed on a substrate and connected in series. FIG. 1 is a sectional view schematically showing such a conventional module.

A module 1 shown in FIG. 1 is primarily composed of a glass substrate 2 and thin-film photovoltaic cells 10. Each thin-film photovoltaic cell 10 has a structure in which a transparent front electrode layer 3, a thin-film photovoltaic semiconductor layer 4, and a metal back electrode layer 5 are sequentially stacked on the glass substrate 2. The electrode layer 5 of each cell 10 is electrically connected to the electrode layer 3 of a cell 10 on its right side in FIG. 1. That is, these cells 10 are connected in series.

The electrode layer 3 electrically connected to the electrode layer 5 of the cell 10 on the right-hand end in FIG. 1 forms an output bus electrode area. The electrode layer 3 of the cell on the left-hand end in FIG. 1 extends outward, and this extending portion also forms an output bus electrode area. Electrode bus bars 12 such as copper foils are attached to these output bus electrode areas by ultrasonic solder 13 or the like.

This module 1 is usually fabricated as follows. First, a transparent front electrode layer 3 is formed as a thin continuous film on a glass substrate 2. Trenches 21 about, e.g., 50 $\mu$m wide are formed by laser scribing to obtain a plurality of strip-like electrode layers 3. Next, a thin-film photovoltaic semiconductor layer 4 is formed as a thin continuous film on these electrode layers 3. In this layer 4 formed as a thin continuous film, trenches 22 for connecting the electrode layers 3 to electrode layers 5 are formed to have a width of, e.g., 100 $\mu$m by laser scribing. Additionally, a metal back electrode layer 5 is formed as a thin continuous film on the layer 4. Trenches 23 about, e.g., 100 $\mu$m thick are formed in this thin continuous film by laser scribing to obtain a plurality of strip-like electrode layers 5. After that, electrode bus bars 12 or the like are attached.

As described above, in the fabrication process of the module 1, thin-film division by laser scribing is performed whenever a thin-film is formed. In this laser scribing thin-film division, slight errors are inevitably produced in the positions of the trenches 21 to 23 because the large-area substrate 2 must be moved at high speed in a plane perpendicular to the optical axis of a laser beam. When such errors are produced, e.g., when errors are produced in the positions of the trenches 21 or 22, the electrode layers 3 and 5 may short in a single cell 10. When errors are produced in the positions of the trenches 22 or 23, the electrode layer 5 of one cell 10 may be incompletely connected to the electrode layer 3 of an adjacent cell 10. Hence, these trenches 21 to 23 are conventionally formed well apart from each other.

When the trenches 21 to 23 are thus formed sufficiently apart from each other, however, the width of each isolation region 15 for separating these thin-film photovoltaic cells 10 increases. Presently, the width of this isolation regions 15 is approximately 500 $\mu$m, about twice as large 250 $\mu$m, the sum of the widths of the trenches 21 to 23 described above. This isolation region 15 does not contribute to the generation of electric power, although it occupies part of the light-receiving surface of the module 1. Therefore, to obtain large output from the module 1 without sacrificing the fabrication yield, it is desired to reduce the width of the isolation region 15, i.e., to improve the accuracy of laser scribing.

BRIEF SUMMARY OF THE INVENTION

Recently, the positional accuracy of light emission has greatly improved by checking the accuracy of a laser beam machine and precisely controlling its operation. Therefore, the width of an isolation region is expected to be largely reduced. In reality, however, even when it is attempted to reduce the width of an isolation region, the spacing between adjacent trenches in a single isolation region becomes much narrower than the designed value. In the worst case, these trenches overlap each other.

The present inventors investigated such defects and have found that the defects occur primarily in the vicinity of a position last irradiated with a laser beam in a thin-film photovoltaic semiconductor layer formed by CVD. From this tendency, the present inventors postulated that the defects are based not on the accuracy of a laser beam machine or the like, but on thermal expansion or thermal shrinkage of a glass substrate. As a result, the present inventors have found that the defects can indeed be prevented when the temperature of a glass substrate is controlled during laser scribing.

According to the present invention, there is provided a method of fabricating a thin-film photovoltaic module, including the following steps. A first electrode layer is formed on a substrate. The first electrode layer is divided by irradiating the first electrode layer with a laser beam in accordance with a first scanning pattern. The first scanning pattern is determined by taking into account a size of the substrate at a first target temperature. A thin-film photovoltaic semiconductor layer is formed on the divided first electrode layer. The thin-film photovoltaic semiconductor layer is divided by irradiating the thin-film photovoltaic semiconductor layer with a laser beam in accordance with a second scanning pattern. The second scanning pattern is determined by taking account of a size of the substrate at a second target temperature. A second electrode layer is formed on the divided thin-film photovoltaic semiconductor layer. The second electrode layer is divided by irradiating the second electrode layer with a laser beam in accordance with a third scanning pattern. The third scanning pattern is determined by taking account of a size of the substrate at a third target temperature. In each of the dividing steps, irradiation with the laser beam is performed under temperature-controlled conditions such that a difference between the target temperature and the temperature of the substrate is in a range from –10° C. to +10° C.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
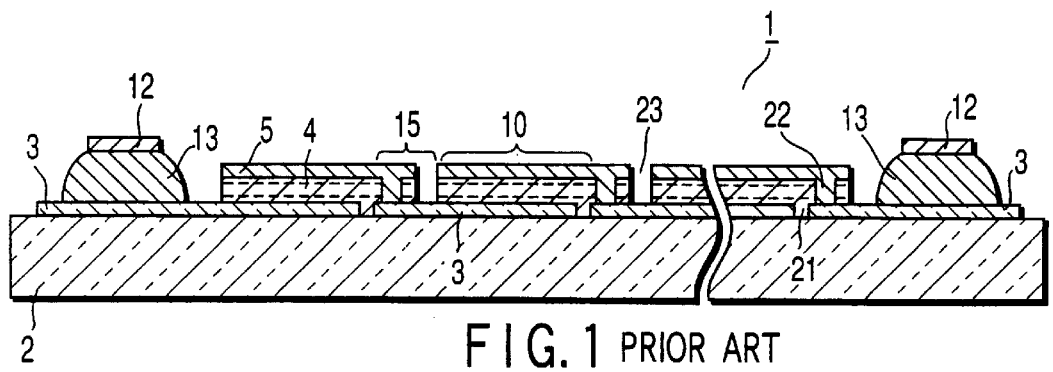
FIG. 1 is a sectional view schematically showing a conventional thin-film photovoltaic module.

The present invention will be described in more detail below with reference to the accompanying drawings. The same reference numerals in these drawings denote the same parts, and a duplicate description thereof will be omitted.

Figure 2:
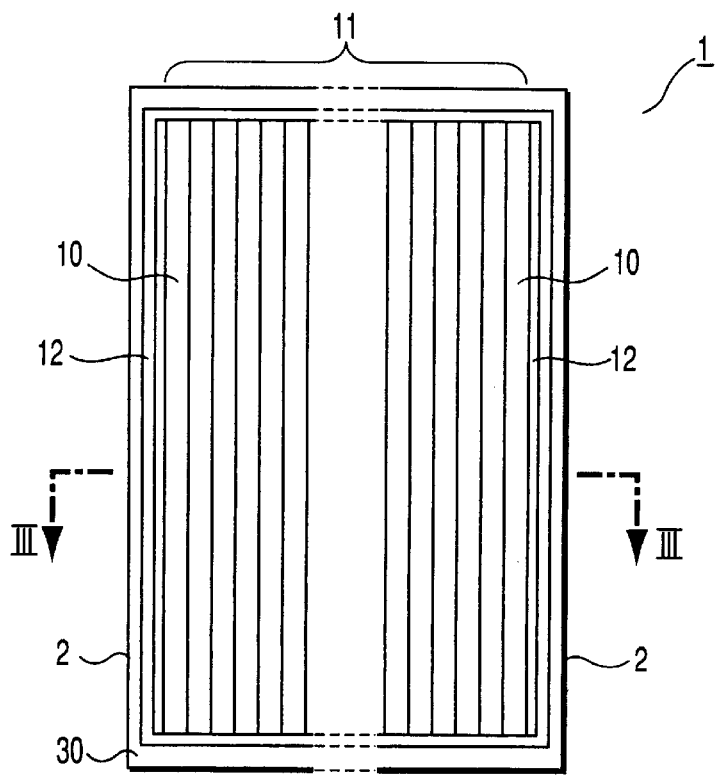
FIG. 2 is a plan view schematically showing a thin-film photovoltaic module fabricated by a method according to the first embodiment of the present invention.

FIG. 2 is a plan view schematically showing a thin-film photovoltaic module according to the first embodiment of the present invention. This thin-film photovoltaic module 1 shown in FIG. 2 has a structure in which a plurality of thin-film photovoltaic cells 10 are integrated on a transparent substrate 2. These cells 10 are connected in series in the lateral direction of FIG. 2 to form a series array 11. A pair of electrode bus bars 12 made of, e.g., ribbon-like copper foils are connected to the two end portions of this series array 11.

The module 1 shown in FIG. 2 will be described in more detail below with reference to FIG. 3.

Figure 3:
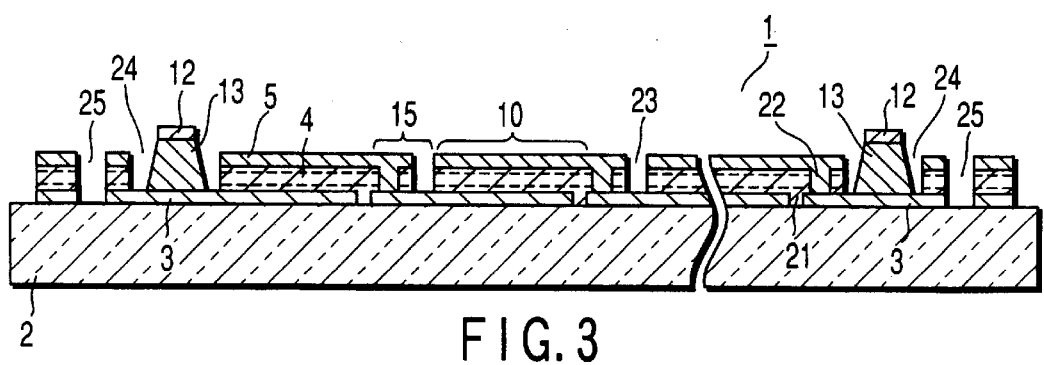
FIG. 3 is a sectional view taken along a line III—III of the thin-film photovoltaic module shown in FIG. 2.

FIG. 3 is a sectional view taken along a line III—III of the module 1 in FIG. 2. In the module 1 according to this embodiment as shown in FIG. 3, the cell 10 has a structure in which a transparent front electrode layer 3 as a first electrode layer, a thin-film photovoltaic semiconductor layer 4, and a metal back electrode layer 5 as a second electrode layer are sequentially stacked. That is, this module 1 photoelectrically transduces light incident from the transparent substrate 2 side by the photovoltaic semiconductor layer 4.

The module 1 shown in FIGS. 2 and 3 can be fabricated by, e.g., the following method.

First, a transparent front electrode layer 3 is formed as a thin large-area film on one principal surface of a transparent substrate 2. This transparent substrate 2 can be formed by a glass plate, a transparent resin film, or the like. The other principal surface of the transparent substrate 2 can be previously subjected to a surface treatment such as an antiglare treatment.

Also, the transparent front electrode layer 3 preferably has a high transmittance of 80% or more with respect to light having a wavelength of 500 to 1,200 nm. For example, this electrode layer 3 can be made from a transparent conductive oxide layer such as an ITO film, $SnO_2$ film, or ZnO film. The electrode layer 3 can have either a single-layered structure or a multilayered structure. Of these thin-films, an $SnO_2$ film is particularly suitable in respect of transmittance, conductivity, and chemical stability. ITO is also suitable in respect of processability, conductivity, and transmittance. The electrode layer 3 can be formed by using a known vapor phase deposition method such as vacuum vapor deposition, thermal CVD, or sputtering.

A surface texture structure including fine projections and recesses is preferably formed on the surface of this transparent front electrode layer 3. By forming this texture structure on the surface of the electrode layer 3, the efficiency of incidence of light to the photovoltaic semiconductor layer 4 can be increased. A method of forming the surface texture structure is not particularly limited, so various known methods can be used.

Next, trenches 21 are formed by laser scribing in the transparent front electrode layer 3 formed as a thin large-area film, thereby dividing this electrode layer 3 in one-to-one correspondence with the cells 10. In this division of the electrode layer 3, it is possible to use a conventionally used laser beam, e.g., the fundamental wave (wavelength 1,060 nm) of a YAG laser.

Although laser scribing of the transparent front electrode layer 3 can be performed from the substrate 2 side, it is preferably performed from the film surface side. When this is the case, damage and the like to the transparent front electrode layer 3 can be prevented.

A thin-film photovoltaic semiconductor layer 4 is then formed on the transparent front electrode layer 3. Consequently, the trenches formed in the electrode layer 3 are filled with the material forming this photovoltaic semiconductor layer 4.

The thin-film photovoltaic semiconductor layer 4 can have various structures; it can have an amorphous silicon-based photovoltaic layer, a polysilicon-based photovoltaic layer, a tandem structure in which one or more amorphous silicon-based photovoltaic layers and one or more polysilicon-based photovoltaic layers are stacked, a CdS/CdTe-based photovoltaic layer, or a $CuInS_2$-based photovoltaic layer. In the following description, the thin-film photovoltaic semiconductor layer 4 primarily made from a silicon-based material will be explained.

As an example, the silicon-based thin-film photovoltaic semiconductor layer 4 has a structure in which a p-type non-single-crystal silicon-based semiconductor layer, a non-single-crystal silicon-based photovoltaic layer, and an n-type non-single-crystal silicon-based semiconductor layer are sequentially stacked. Each of these p-type semiconductor layer, photovoltaic layer, and n-type semiconductor layer can be formed by plasma CVD in which the substrate temperature is set at 400° C. or less. As this plasma CVD, it is possible to use generally well-known parallel plate type RF plasma CVD or plasma CVD using a high-frequency power supply from an RF band of 150 MHz or less to a VHF band.

The p-type silicon-based semiconductor layer is formed by doping p-type impurity atoms, such as boron or aluminum atoms, into a silicon-based material. Examples of the silicon-based material used as the p-type silicon-based semiconductor layer are amorphous silicon, silicon alloys such as amorphous silicon carbide and amorphous silicon germanium, polycrystalline silicon and its alloy material, and crystallite silicon partially containing amorphous silicon and its alloy material. Where necessary, the crystallization ratio and the carrier concentration can be controlled by irradiating the p-type silicon-based semiconductor layer with a pulse laser beam, i.e., by laser-annealing the layer.

The photovoltaic layer formed on this p-type semiconductor layer can be formed by a non-single-crystal silicon-based semiconductor material. As this material, it is possible to use nondoped (intrinsic semiconductor) polycrystalline silicon, crystallite silicon, amorphous silicon, or a $p^-$- or $n^-$-type silicon-based material containing a slight amount of an impurity and having a satisfactory photovoltaic function. As the non-single-crystal silicon-based semiconductor material forming the photovoltaic layer, a silicon alloy such as silicon carbide or silicon germanium can also be used. To obtain a necessary and satisfactory photovoltaic function, the photovoltaic layer is generally formed to have a thickness of 0.5 to 20 $\mu$m.

The n-type silicon-based semiconductor layer formed on the photovoltaic layer is formed by doping n-type impurity atoms, such as phosphorous or nitrogen atoms, into the silicon-based material. Examples of the silicon-based material used as the p-type silicon-based semiconductor layer are amorphous silicon, silicon alloys such as amorphous silicon carbide and amorphous silicon germanium, polycrystalline silicon and its alloy material, and crystallite silicon partially containing amorphous silicon and its alloy material.

After the thin-film photovoltaic semiconductor layer 4 is formed as described above, trenches 22 are formed in the photovoltaic semiconductor layer 4 by laser scribing. These trenches 22 are provided for electrically connecting the transparent front electrode layer 3 of a certain cell 10 to the metal back electrode layer 5 of an adjacent cell 10.

In this embodiment, the thin-film photovoltaic semiconductor layer 4 is made from a silicon-based material. Therefore, this thin-film photovoltaic semiconductor layer 4 can be divided by using a conventionally used laser beam, such as the second harmonic (wavelength 530 nm) of a YAG laser. As in the case of the transparent front electrode layer 3, laser scribing of the thin-film photovoltaic semiconductor layer 4 is preferably performed from the film surface side. When this is the case, damage and the like to the film surface can be prevented.

A metal back electrode layer 5 is thus formed on the photovoltaic semiconductor layer 4. Consequently, the trenches 22 formed in the photovoltaic semiconductor layer 4 are filled with the metal material to electrically connect the metal back electrode layer 5 to the transparent front electrode layer 3.

This metal back electrode layer 5 not only has a function as an electrode but also has a function as a reflecting layer for reflecting light, which has entered the photovoltaic semiconductor layer 4 and arrived at the back electrode layer 5, and again sending the light into the photovoltaic semiconductor layer 4. The electrode layer 5 can be formed to have a thickness of, e.g., about 200 to 400 nm. This electrode layer 5 is preferably made of a metal selected from silver, gold, aluminum, copper, and platinum, or an alloy containing these metals. For example, when silver having high light reflectance is used, the electrode layer 5 can be formed by vacuum vapor deposition at a temperature of 100 to 330° C., more preferably, 200 to 300° C. Formation by sputtering at room temperature is also suitable.

A thin transparent conductive film (not shown) made from a nonmetal material can also be formed between the metal back electrode layer 5 and the photovoltaic semiconductor layer 4, in order to improve the adhesion between them and prevent chemical changes in the photovoltaic semiconductor layer 4. This thin transparent conductive film is preferably made from at least one oxide selected from ITO, $SnO_2$, and ZnO, and more preferably, contains ZnO as a main component. When the thin transparent conductive film contains ZnO as a main component, the film thickness is preferably 50 nm to 1 $\mu$m, and the specific resistance is preferably $1.5\times10^{-3}$ $\Omega$cm or less.

Trenches 23 and 24 are formed in the metal back electrode layer 5 by laser scribing to electrically insulate the metal back electrode layer 5 between the cells 10. Generally, the material forming the metal back electrode layer 5 hardly absorbs a conventionally used laser beam such as the fundamental wave (wavelength 1,060 nm) or the second harmonic (wavelength 530 nm) of a YAG laser. Therefore, the trenches 23 and 24 are formed by using sublimation occurring when the thin-film photovoltaic semiconductor layer 4 is irradiated with, e.g., the second harmonic (wavelength 530 nm) of a YAG laser from the transparent substrate 2 side. Hence, these trenches 23 and 24 are formed in the thin-film photovoltaic semiconductor layer 4 as well as in the metal back electrode layer 5.

After that, trenches 25 are formed in the transparent front electrode layer 3, the thin-film photovoltaic semiconductor layer 4, and the metal back electrode layer 5 by laser scribing. These trenches 25 are so formed as to surround the series array 11 and thereby form a power generation region having the series array 11 and the electrode bus bars 12 and a peripheral region surrounding this power generation region. Note that the formation of the trenches 25 requires irradiation with the fundamental wave (wavelength 1,060 nm) and the second harmonic (wavelength 530 nm) of a YAG laser.

After the trenches 25 are formed by the above method, a pair of electrode bus bars 12 are attached to the two end portions of the series array 11 via a bonding material such as ultrasonic solder or an adhesive 13 such as a conductive resin. In this manner the module 1 is completed.

Commonly, a polymer protective film (not shown) is provided on the back surface of this module 1 via a sealing resin layer (not shown). Also, a frame member is usually attached to the perimeter of the module 1.

The sealing resin layer is for sealing each thin-film photovoltaic cell 10 formed on the transparent substrate 2. A resin capable of adhering a polymer protective film to these cells 10 is used for this sealing resin layer. Examples of the resin are a thermoplastic resin, a thermosetting resin, and a photo-setting resin. For example, it is possible to use EVA (ethylene-vinylacetate copolymer), PVB (polyvinylbutyral), PIB (polyisobutyrene), and silicone resin.

As the polymer protective film, it is possible to use an insulating film having high humidity resistance and high water resistance, e.g., a fluorine resin-based film such as a polyvinyl fluoride film (e.g., Tedler Film (registered trade name)) or a PET film. This polymer protective film can have either a single-layered structure or a stacked structure in which such single-layered structures are stacked. Furthermore, the polymer protective film can have a structure in which a metal foil such as an aluminum foil is sandwiched between these films. A metal foil such as an aluminum foil has a function of improving the humidity resistance and the water resistance. Hence, when the polymer protective film is given a structure like this, the thin-film photovoltaic cells 10 can be protected from moisture more effectively.

These sealing resin and polymer protective film can be simultaneously adhered to the back surface of the thin-film photovoltaic module 1 by vacuum lamination.

In the present invention as described earlier, defects in the separation step are suppressed by controlling the temperature of the transparent substrate during laser scribing, i.e., by take into account changes in size based on thermal expansion or thermal shrinkage of the transparent substrate. Details of this principle will be described below.

Generally, the module 1 is fabricated using the transparent substrate 2 on the surface of which the transparent electrode layer 3 is previously formed. Hence, the trenches 21 are formed in this transparent electrode layer 3 after the substrate 2 is sufficiently cooled. That is, usually the temperature of the substrate 2 when these trenches 21 are formed is presumably substantially equal to room temperature. Accordingly, in a case like this the trenches 21 can be formed substantially as designed.

In contrast, the trenches 22 are generally formed in the thin-film photovoltaic semiconductor layer 4 immediately after the formation of the photovoltaic semiconductor layer 4 by CVD. Hence, the temperature of the substrate 2 when these trenches 22 are formed is much higher than room temperature. That is, the substrate 2 has thermally expanded. Commonly, the trenches 22 are formed by irradiating the thin-film photovoltaic semiconductor layer 4 with a laser beam while the optical axis of this laser beam and the substrate 2 are moved parallel to each other. That is, the trenches 22 are formed by scanning a laser beam by a predetermined scanning pattern with respect to the thin-film photovoltaic semiconductor layer 4. This scanning pattern is usually determined by taking the size of the substrate 2 at room temperature into consideration. Therefore, defects as described previously are produced if the trenches 22 are formed on the thermally expanded substrate 2.

More specifically, the substrate 2 is aligned by using its end portion, and laser scribing is started from this end portion used in the alignment. Accordingly, at this end portion from which scribing is started, the spacing between the trenches 21 and 22 is substantially equal to the designed value. However, at an end portion at which scribing is completed, the influence the thermal expansion of the substrate 2 has on the position of the trench 21 is far larger than that at the end portion from which scribing is started. Consequently, at the end portion at which scribing is completed the spacing between the trenches 21 and 22 is much smaller than the designed value.

On the other hand, the trenches 23 are commonly formed in the metal back electrode layer 5 which was formed by sputtering. So, the temperature of the substrate 2 is not so high even immediately after the formation of the electrode layer 5. Hence, these trenches 23 can be formed substantially as designed. Note that the trenches 22 are not formed as designed at the end portion at which scribing is completed. Therefore, at this end portion the spacing between the trenches 22 and 23 tends to be larger than the designed value.

As described above, the conventional method does not at all take account of the influence of thermal expansion or thermal shrinkage of the substrate 2. This poses the aforementioned problems. Therefore, defects as described above can be prevented by taking the influence of thermal expansion or thermal shrinkage of the substrate 2 into consideration from the designing stage and by maintaining the temperature of the substrate 2 during scribing at a target temperature used in the design or a temperature in its neighborhood. That is, the module 1 need only be fabricated as follows.

(1) Postulate the temperature of the substrate 2 during scribing for each of the transparent front electrode layer 3, the thin-film photovoltaic semiconductor layer 4, and the metal back electrode layer 5. That is, define target temperatures.

(2) Determine a scanning pattern for each of the trenches 21 to 23 by taking account of the pattern of the trench and the size of the substrate 2 at the target temperature defined in (1).

(3) Form each of the trenches 21 to 23 in accordance with the scanning patterns defined in (2) while maintaining the temperature of the substrate 2 at the target temperatures defined in (1) or temperatures in their neighborhood.

This method can form the trenches 21 to 23 substantially as designed. Accordingly, the spacings between the trenches 21 to 23 can be narrowed without producing any defects as described previously. That is, it is possible to increase the output (particularly the output current) without sacrificing the fabrication yield and reduce the fabrication cost.

The above effects can be obtained when the difference between the actual temperature of the substrate 2 during laser scribing and the target temperature is in a range from $-10°$ C. to $+10°$ C. This range is preferably from $-5°$ C. to $+5°$ C., and more preferably, from $-2°$ C. to $+2°$ C.

Also, the abovementioned target temperature is preferably equivalent to room temperature around the laser scriber. This allows easy and accurate temperature control of the substrate 2 during laser scribing. However, the target temperature is not limited to this one. If the temperature of the substrate 2 during laser scribing can be controlled with sufficiently high accuracy, the target temperature can be set to be higher by $10°$ C. or more than the ambient temperature of the laser scriber. That is, even if the substrate 2 has thermally expanded before laser scribing, the trenches 21 to 23 can be formed as designed provided that the difference between the temperature of the substrate 2 and the target temperature is within the above range.

The second embodiment of the present invention will be described below. In this embodiment, only the difference from the first embodiment will be explained.

In the fabrication of a thin-film photovoltaic module, trenches 21 to 25 explained in the first embodiment are generally formed by laser scribing using a single-mode laser beam. Unfortunately, it is very difficult to obtain a high-output laser beam by single mode, and such a laser scriber is expensive. Also, it is difficult to stably obtain a single-mode laser beam with fixed output.

In this embodiment, therefore, in addition to performing temperature control explained in the first embodiment, trenches 22 and 23 are formed using a single-mode laser beam, and trenches 21 are formed using a multi-mode laser beam. By thus selectively using a single-mode laser beam and a multi-mode laser beam in accordance with a thin film in which trenches are to be formed, a high-quality thin-film photovoltaic module can be stably obtained at low fabrication cost compared to the method by which trenches are formed using a single-mode laser beam in all thin films.

A laser used in this embodiment can be a solid-state laser or a gas laser. In this embodiment, the fundamental wave or the second harmonic of a solid-state laser, particularly a YAG laser is suitably used.

A single-mode laser beam is obtained by placing a mode selector having an aperture for shutting off marginal light beams on the output side of a solid-state laser rod, e.g., a YAG rod and extracting only a laser beam of single mode oscillation. On the other hand, a multi-mode laser beam is obtained by increasing the diameter of the aperture to be larger than the value when a single-mode laser beam is extracted.

Strictly speaking, even a single-mode laser beam contains multi-mode components, so the difference between them is not necessarily clear. Therefore, in this embodiment the single mode and the multi mode are defined as follows.

That is, a solid-state laser is in the single mode if the value of $M^2$ (beam quality) is 2 or less, and in the multi mode if this value is larger than 2. Analogously, a gas laser is in the single mode if the value of $M^2$ is 1.2 or less, and in the multi mode if this value is larger than 1.2.

Note that $M^2$ is defined by $$W(f) = (4 \times M^2 \times \lambda \times f)/(\pi \times W_O)$$

where W(f) is the beam diameter at the focal point when a laser beam is narrowed by inserting a lens having a focal distance f, $\lambda$ is the wavelength, and $W_O$ is the beam diameter at the exit aperture of the laser. In a strict sense, $W_O = 1$ in the single mode.

In this embodiment, to form trenches 25, a thin-film photovoltaic semiconductor layer 4 and a metal back electrode layer 5 can be laser-scribed by using a single-mode laser beam. Also, to form trenches 24 and/or trenches 25, a transparent front electrode layer 3, a thin-film photovoltaic semiconductor layer 4, and a metal back electrode layer 5 can be laser-scribed by using a multi-mode laser beam.

A method of fabricating a module 1 according to the second embodiment will be described below in order of steps.

(1) First, on a transparent substrate 2 made of, e.g., glass, a first electrode layer 3 is formed as a plurality of thin rectangular films extending along one direction in the principal surface of the substrate 2 and spaced apart from each other by trenches 21. This first electrode layer 3 is made from a transparent conductive metal oxide, e.g., tin oxide ($SnO_2$), indium tin oxide (ITO), or zinc oxide (ZnO).

The first electrode layer 3 is formed using a method by which the entire upper surface of the insulating transparent substrate 2 is coated with a metal oxide layer, and those portions of this metal oxide layer, which correspond to the trenches 21 are removed by scribing using a multi-mode laser beam.

(2) Next, on this first electrode layer 3, a p-type hydrogenated amorphous silicon-carbide (a-SiC:H) layer, an i-type hydrogenated amorphous silicon (a-Si:H) layer, and an n-type hydrogenated amorphous silicon layer are sequentially formed to obtain a thin-film photovoltaic semiconductor layer 4.

(3) After that, trenches 22 are formed in the photovoltaic semiconductor layer 4 by scribing using a single-mode laser beam. In this stage, each individual region of the photovoltaic semiconductor layer 4 is formed across two adjacent regions of the first electrode layer 3.

(4) Subsequently, a second electrode layer 5 made of a metal material such as aluminum (Al) or silver (Ag) is formed on the photovoltaic semiconductor layer 4.

(5) At least portions of the second electrode layer 5 are removed by scribing using a single-mode laser beam in a direction parallel to the trenches 22, thereby forming trenches 23.

(6) Next, portions of the photovoltaic semiconductor layer 4 and the second electrode layer 5 are removed by scribing using a single-mode laser beam to form trenches 24 for attaching electrode bus bars 12. Also, trenches 25 are formed outside the trenches 24 by removing portions of the first electrode layer 3, the photovoltaic semiconductor layer 4, and the second electrode layer 5 by scribing using a multi-mode laser beam, thereby separating a power generation region from a peripheral region.

Additionally, the peripheral portions of the first electrode layer 3, the photovoltaic semiconductor layer 4, and the second electrode layer 5, that are outside the trenches 25 are removed along the entire substrate perimeter by any arbitrary method.

(7) Subsequently, electrode bus bars 12 made of, e.g., a solder-plated copper foil are attached to regions at the two end portions of a series array 11 of the first electrode layer 3 via a bonding material such as ultrasonic solder or an adhesive 13 such as a conductive resin. This electrically connects the first electrode layer 3 to the electrode bus bars 12. The thin-film photovoltaic module 1 having the electrode bus bars 12 is completed in this state. However, this module 1 is coated with a passivation resin or the like or a frame member is attached to the perimeter of the substrate 2 where necessary.

In this embodiment as described above, a single-mode laser beam and a multi-mode laser beam can be selectively used in accordance with each thin film in which trenches are to be formed. In this embodiment, therefore, not only the effects explained in the first embodiment can be obtained, but also a high-quality thin-film photovoltaic module can be stably obtained at low fabrication cost compared to the method by which trenches are formed using a single-mode laser beam in all thin films. Note that these additional effects can be obtained without performing temperature control of the substrate 2 explained in the first embodiment. That is, the technique explained in this second embodiment is very useful in this field of art without ever being combined with the technique explained in the first embodiment.

The third embodiment of the present invention will be described below. In this embodiment, only differences from the first embodiment will be explained.

In the fabrication of a thin-film photovoltaic module, trenches 21 to 25 are generally formed by laser scribing using the fundamental wave or the second harmonic of a YAG laser. This laser scribing method is required to further improve its processability. Also, since a second electrode layer 5 reflects the fundamental wave or the second harmonic of a YAG laser as mentioned earlier, trenches 23 and the like cannot be formed by emitting a laser beam from the film surface side. Therefore, the trenches 23 and the like are formed using sublimation occurring when a thin-film photovoltaic semiconductor layer 4 is irradiated with the second harmonic of a YAG laser or the like from the transparent substrate 2 side. That is, the trenches 23 and the like are formed indirectly. In this indirect method, microfabrication is difficult to perform.

This embodiment takes the above situation into consideration and can stably fabricate a high-quality thin-film photovoltaic module 1 with high accuracy by laser scribing of various thin films formed on the substrate 2 with high processability and high degree of freedom. That is, in this embodiment, in addition to temperature control explained in the first embodiment, trenches 21 are formed in a first electrode layer 3 by using the fundamental wave, second harmonic, or third harmonic of a YAG laser. Also, trenches 22 are formed in a thin-film photovoltaic semiconductor layer 4 by using the second or third harmonic of a YAG laser. In addition, trenches 23 are formed in a second electrode layer 5 by using the second or third harmonic of a YAG laser. Furthermore, trenches 25 are formed in the electrode layer 3, the photovoltaic semiconductor layer 4, and the electrode layer 5 by using the second or third harmonic of a YAG laser. At least one of these trenches 21 to 23 and 25 is formed using the third harmonic of a YAG laser.

In this embodiment, it is possible to divide the first electrode layer 3 by emitting a laser beam from the film surface side. Also, in this embodiment, it is possible to divide the photovoltaic semiconductor layer 4 by emitting a laser beam from the film surface side or from the substrate 2 side. In addition, it is possible to partially remove the electrode layer 3, the photovoltaic semiconductor layer 4, and the electrode layer 5 from the perimeter of the substrate 2 by emitting a laser beam from the film surface side or from the substrate 2 side.

Also, in this embodiment, the electrode layer 3, the photovoltaic semiconductor layer 4, and the electrode layer 5 can be partially removed simultaneously from the perimeter of the substrate 2 by emitting the third harmonic of a YAG laser from the film surface side or the substrate 2.

Note that the combinations of laser beams are most preferably such that the first electrode layer 3 is divided using the fundamental wave of a YAG laser. Also, the trenches 22 are formed in the photovoltaic semiconductor layer 4 by using the second harmonic of a YAG laser. In addition, the second electrode layer 5 is divided using the third harmonic of a YAG laser. Furthermore, the electrode layer 3, the photovoltaic semiconductor layer 4, and the electrode layer 5 are partially removed from the perimeter of the substrate by using the third harmonic of a YAG laser.

As described above, this embodiment is characterized in that the third harmonic of a YAG laser is used in at least one laser scribing of various thin films formed on a substrate in the fabrication of the module 1. The third harmonic of a YAG laser has one third the wavelength of that of the fundamental wave. It has been considered difficult to use this third harmonic in laser scribing in the fabrication of the module 1, since the cost increases and high output cannot be obtained. Additionally, in the past, no advantages associated with the use of the third harmonic were known. Accordingly, the third harmonic of a YAG laser has not been used in laser scribing in the fabrication of the module 1.

The present inventors have found that the third harmonic of a YAG laser is readily usable in the fabrication of the module 1 and that the use of this third harmonic brings about diverse characteristic effects. That is, the third harmonic is superior in processability to the fundamental wave or the second harmonic and particularly suited to microfabrication as in the fabrication of the module 1.

Since high output cannot be obtained from the third harmonic, the third harmonic has been considered to be unusable in the formation of trenches in a thin film, such as the transparent front electrode layer 3, which requires laser scribing to have high output. However, the present inventors have found that the third harmonic can form trenches in the transparent front electrode layer 3 without requiring high output.

Furthermore, in conventional laser scribing of the metal back electrode layer 5, the photovoltaic semiconductor layer 4 is irradiated with a laser beam from the transparent substrate 2 side to cause sublimation and with this sublimation the trenches 23 are formed in the metal back electrode layer 5. This is so because the metal back electrode layer 5 hardly absorbs but reflects the fundamental wave and the second harmonic of a YAG laser. In contrast, when the third harmonic of a YAG laser is used it is possible to directly irradiate the film surface of the metal back electrode layer 5 with a laser beam and scribe only this electrode layer 5.

When the third harmonic of a YAG laser is not used, the trenches 25 are formed by scribing the transparent front electrode layer 3 and scribing the photovoltaic semiconductor layer 4 and the metal back electrode layer 5. That is, the formation of the trenches 25 requires two scribing steps. on the other hand, the use of the third harmonic makes it possible to form the trenches 25 in all of the electrode layer 3, the photovoltaic semiconductor layer 4, and the electrode layer 5 by one scribing step.

In this embodiment, the following combinations of laser beams (YAG lasers) are possible in the division of the transparent front electrode layer 3, the formation of the trenches 24 in the thin-film photovoltaic semiconductor layer 4, the division of the metal back electrode layer 5, and the formation (periphery separation) of the trenches 25 for separating a power generation region from a peripheral region.

1)
Transparent electrode layer: Fundamental wave
Photovoltaic semiconductor layer: Second harmonic
Metal electrode layer: Third harmonic
Periphery separation: Third harmonic 2)
Transparent electrode layer: Second harmonic
Photovoltaic semiconductor layer: Third harmonic
Metal electrode layer: Third harmonic
Periphery separation: Third harmonic 3)
Transparent electrode layer: Second harmonic
Photovoltaic semiconductor layer: Second harmonic
Metal electrode layer: Third harmonic
Periphery separation: Third harmonic 4)
Transparent electrode layer: Second harmonic
Photovoltaic semiconductor layer: Third harmonic
Metal electrode layer: Second harmonic
Periphery separation: Third harmonic 5)
Transparent electrode layer: Fundamental wave
Photovoltaic semiconductor layer: Third harmonic Metal electrode layer: Second harmonic
Periphery separation: Third harmonic 6)
Transparent electrode layer: Fundamental wave
Photovoltaic semiconductor layer: Third harmonic
Metal electrode layer: Third harmonic
Periphery separation: Third harmonic Of the above combinations, the most remarkable effect can be obtained when combinations 1) and 2) are used. However, combinations are not limited to the above ones, and various other combinations are possible. Note, however, that at least one scribing step must include laser scribing using the third harmonic.

In this embodiment, laser scribing can be performed by emitting a laser beam from the transparent substrate 2 side or by emitting a laser beam directly from the film surface side. One of these processing forms is chosen in accordance with the thin film to be scribed.

For example, scribing of the transparent front electrode layer 3 requires high output, so the transparent substrate 2 may be damaged if a laser beam is emitted from the substrate 2 side. Therefore, scribing of the transparent front electrode layer 3 is preferably performed by emitting a laser beam directly from the film surface side.

Scribing of the thin-film photovoltaic semiconductor layer 4 can be performed by either emission form. Normally, this scribing is performed by emitting a laser beam from the transparent substrate 2 side. To scribe the photovoltaic semiconductor layer 4 and the metal back electrode layer 5 at the same time, a laser beam must be emitted from the transparent substrate 2 side. To scribe the metal back electrode layer 5 alone, a laser beam is naturally emitted directly from the film surface side.

A method of fabricating the module 1 according to the third embodiment will be described below in order of steps.

(1) First, on a transparent substrate 2 made of, e.g., glass, a first electrode layer 3 is formed as a plurality of thin rectangular films extending along one direction in the principal surface of the substrate 2 and spaced apart from each other by trenches 21. This first electrode layer 3 is made from a transparent conductive metal oxide, e.g., tin oxide ($SnO_2$), indium tin oxide (ITO), or zinc oxide (ZnO).

The first electrode layer 3 is formed using a method by which the entire upper surface of the insulating transparent substrate 2 is coated with a metal oxide layer, and those portions of this metal oxide layer, which correspond to the trenches 21 are removed by scribing using one of the fundamental wave, second harmonic, and third harmonic of a YAG laser.

(2) Next, on this first electrode layer 3, a p-type hydrogenated amorphous silicon-carbide (a-SiC:H) layer, an i-type hydrogenated amorphous silicon (a-Si:H) layer, and an n-type hydrogenated amorphous silicon layer are sequentially formed to obtain a thin-film photovoltaic semiconductor layer 4.

(3) After that, trenches 22 are formed in the photovoltaic semiconductor layer 4 by scribing using the second or third harmonic of a YAG laser. In this stage, each individual region of the photovoltaic semiconductor layer 4 is formed across two adjacent regions of the first electrode layer 3.

(4) Subsequently, a second electrode layer 5 made of a metal material such as aluminum (Al) or silver (Ag) is formed on the photovoltaic semiconductor layer 4.

(5) At least portions of the second electrode layer 5 are removed by scribing using the second or third harmonic of a YAG laser in a direction parallel to the trenches 22, thereby forming trenches 23.

(6) Next, portions of the photovoltaic semiconductor layer 4 and the second electrode layer 5 are removed by scribing using the second or third harmonic of a YAG laser to form trenches 24 for attaching electrode bus bars 12. Also, trenches 25 are formed outside the trenches 24 by removing portions of the first electrode layer 3, the photovoltaic semiconductor layer 4, and the second electrode layer 5 by scribing using the second or third harmonic of a YAG laser, thereby separating a power generation region from the peripheral region.

Additionally, the peripheral portions of the first electrode layer 3, the photovoltaic semiconductor layer 4, and the second electrode layer 5, that are outside the trenches 25 are removed along the entire substrate perimeter by any arbitrary method.

(7) Subsequently, electrode bus bars 12 made of, e.g., a solder-plated copper foil are attached to regions at the two end portions of a series array 11 of the first electrode layer 3 via a bonding material such as ultrasonic solder or an adhesive 13 such as a conductive resin. This electrically connects the first electrode layer 3 to the electrode bus bars 12. The thin-film photovoltaic module 1 having the electrode bus bars 12 is completed in this state. However, this module 1 is coated with a passivation resin or the like or a frame member is attached to the perimeter of the substrate 2 where necessary.

In this embodiment as described above, the third harmonic of a YAG laser that has not been conventionally used is used in the laser scribing steps conventionally performed by using the fundamental wave or the second harmonic of a YAG laser. Especially in this embodiment, the fundamental wave, second harmonic, and third harmonic of a YAG laser are appropriately selectively used in accordance with the thin film in which trenches are to be formed. In this embodiment, therefore, not only the effects explained in the first embodiment can be obtained, but also a high-quality thin-film photovoltaic module can be stably obtained at low fabrication cost compared to the method by which trenches are formed using a single-mode laser beam in all thin films. Note that these additional effects can be obtained without temperature control of the substrate 2 explained in the first embodiment. That is, the technique explained in this third embodiment is very useful in this field of art without ever being combined with the technique explained in the first embodiment.

The fourth embodiment of the present invention will be described below. In this embodiment, only differences from the first embodiment will be explained.

As described above, a metal back electrode layer 5 has low absorbance to the fundamental wave and the second harmonic of a YAG laser and reflects most of these waves. Hence, this metal back electrode layer 5 cannot be directly divided by these laser beams, unlike a transparent front electrode layer 3 and a thin-film photovoltaic semiconductor layer 4. Accordingly, the metal back electrode layer 5 is conventionally divided by using sublimation occurring when the thin-film photovoltaic semiconductor layer is irradiated with a laser beam. That is, this electrode layer 5 is divided by an indirect method by which a laser beam is emitted from the transparent substrate 2 side.

When the metal back electrode layer 5 is divided by this method, however, the division of the electrode layer 5 becomes imperfect in some instances. Additionally, the film surface is easily damaged during the fabrication process.

This makes the performance of the module unsatisfactory or reduces the fabrication yield of the module.

This embodiment has been made in consideration of the above situation and provides a thin-film photovoltaic module fabrication method which effectively reduces the fabrication cost. This embodiment also provides a thin-film photovoltaic module having satisfactory performance and a fabrication method of the same.

To solve the above problems, the present inventors first hypothesized that the metal back electrode layer 5 is imperfectly divided by the method according to the prior art because a laser beam is emitted from the transparent substrate 2 side, and so defects existing in the substrate 2 interfere with the division of the electrode layer 5. The present inventors also hypothesized that the film surface is readily damaged by the method according to the prior art because a laser scriber is so designed as to emit a laser beam downward for the sake of safety, and so in order to divide the metal back electrode layer 5 it is necessary to vertically invert the substrate 2 such that the thin-film photovoltaic semiconductor layer 4 is irradiated with a laser beam, i.e., the film surface faces down.

Hence, the present inventors made extensive studies to prove that the above problems can be solved when the metal back electrode layer 5 is divided by emitting a laser beam from the film surface side. Consequently, the present inventors have found that the electrode layer 5 can be divided by emission of a laser beam from the film surface side and therefore all the above problems can be solved by using a laser beam having a wavelength of 400 nm or less which can be absorbed by the metal back electrode layer 5 at sufficiently high efficiency, or by forming on this metal back electrode layer 5 a light-absorbing layer containing a subliming material which absorbs a laser beam having a wavelength of 600 nm or less at a higher efficiency than that of the electrode layer 5. Furthermore, the present inventors have found that when the metal back electrode layer 5 is divided by emitting a laser beam from the film surface side, a structure entirely different from that when a laser beam is emitted from the substrate 2 side is formed.

That is, in this embodiment the metal back electrode layer 5 is divided by irradiating this electrode layer 5 with a laser beam having a wavelength of 400 nm or less from the back surface. Alternatively, in this embodiment the metal back electrode layer 5 is divided by forming on this electrode layer 5 a light-absorbing layer containing a subliming material which absorbs a laser beam having a wavelength of 600 nm or less at a higher efficiency than that of the material of the electrode layer 5, and by using sublimation of the subliming material in a laser-irradiated portion of the light-absorbing layer produced when this light-absorbing layer is irradiated with a laser beam from the back surface. Note that when the metal back electrode layer 5 is divided by this method, this electrode layer 5 is so formed as to partially expose the perimeter on the upper surface of the thin-film photovoltaic semiconductor layer 4.

In this embodiment, the metal back electrode layer 5 is made of a metal material, such as silver or aluminum, having high reflectance and high conductivity.

In this embodiment, the third harmonic of a solid-state laser containing yttrium is an example of a laser beam having a wavelength of 400 nm or less. Also, the second harmonic of a solid-state laser containing yttrium is an example of a laser beam having a wavelength of 600 nm or less.

In this embodiment, as a subliming material it is possible to use a material containing at least one type of a material selected from the group consisting of titanium, chromium, tungsten, magnesium, silicon oxide, aluminum oxide, and zinc oxide.

In this embodiment, the thin-film photovoltaic semiconductor layer 4 can be made from, e.g., a silicon-based material.

In this embodiment as described above, the metal back electrode layer 5 can be divided from the film surface side. This eliminates the need for an apparatus for reversing the obverse and reverse sides of the transparent substrate 2. Accordingly, this embodiment can reduce the installation cost and the like. Also, since the metal back electrode layer 5 can be divided from the film surface side, a transparent substrate 2 whose light incident surface has been previously subjected to a surface treatment such as an antiglare treatment can be used.

The forth embodiment will be described in more detail below.

Figure 4A:
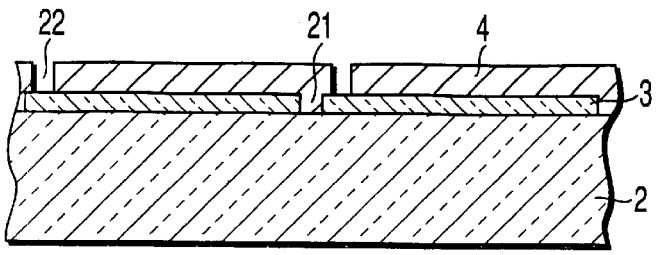
FIGS. 4A to 4C are sectional views schematically showing the first fabrication process of a thin-film photovoltaic module according to the fourth embodiment of the present invention.
Figure 4B:
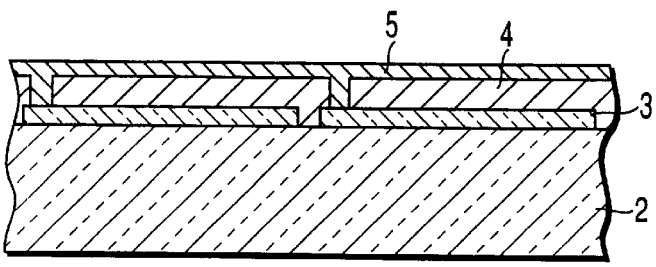
Figure 4C:
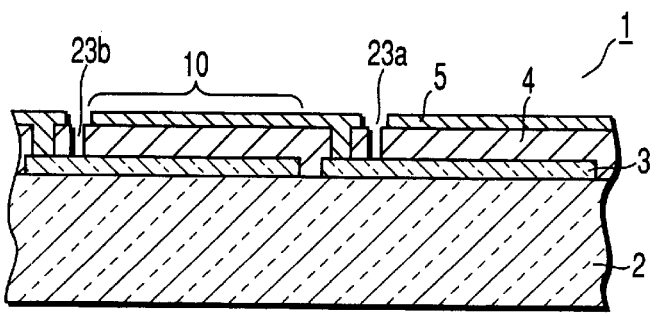

FIGS. 4A to 4C are sectional views schematically showing the first fabrication process of a thin-film photovoltaic module 1 according to the fourth embodiment of the present invention. The module 1 is shown in FIG. 4C.

This module 1 shown in FIG. 4C can be obtained by, e.g., the first fabrication method described below.

First, a structure shown in FIG. 4A is obtained following the same procedure as explained in the first embodiment. Note that although laser scribing of a transparent front electrode layer 3 and a thin-film photovoltaic semiconductor layer 4 can be. performed from the substrate 2 side, it is preferably performed from the film surface side. When this is the case, damage and the like to the electrode layer 3 and the photovoltaic semiconductor layer 4 can be prevented.

Next, as shown in FIG. 4B, a metal back electrode layer 5 is formed on the photovoltaic semiconductor layer 4 following the same procedure as explained in the first embodiment. Consequently, a trench 22 formed in this photovoltaic semiconductor layer 4 is filled with the metal material. This electrically connects the metal back electrode layer 5 to the transparent front electrode layer 3.

After that, as shown in FIG. 4C, a trench 23a is formed in the metal back electrode layer 5 by laser scribing using a laser beam having a wavelength of 400 nm or less, thereby electrically insulating the electrode layer 5 between cells 10. Generally, the material forming the metal back electrode layer 5 absorbs a laser beam having a wavelength of 400 nm or less at sufficiently high efficiency. In this method, therefore, a laser beam for forming the trench 23a can be emitted from the film surface side.

In this method, a laser beam source used in the formation of the trench 23a is not particularly limited as long as it outputs a laser beam having a wavelength of 400 nm or less. This laser beam source can be any of a solid-state laser, a liquid laser, and a gas laser such as an excimer laser or a nitrogen laser. Usually, a laser beam source which outputs a laser beam having a wavelength of 250 nm or more is used. Examples of this laser beam are the third and fourth harmonics of a solid-state laser containing yttrium such as YAG or $YVO_4$.

The power and beam diameter of a laser beam used in the formation of the trench 23a, the relative velocity between the substrate 2 and the optical axis of the laser beam, and the like change in accordance with, e.g., the material and thickness of the metal back electrode layer 5 and the width of the trench 23a formed. Generally, the power, frequency, and beam diameter of a laser beam are 0.2 to 2 W, 5 to 50 kHz, and 30 to 100 μm, respectively, and the relative velocity between the substrate 2 and the optical axis of the laser beam is 100 to 1,000 mm/sec. When this is the case, the trench 23a can be formed to have a width of 30 to 100 µm.

Figure 5A:
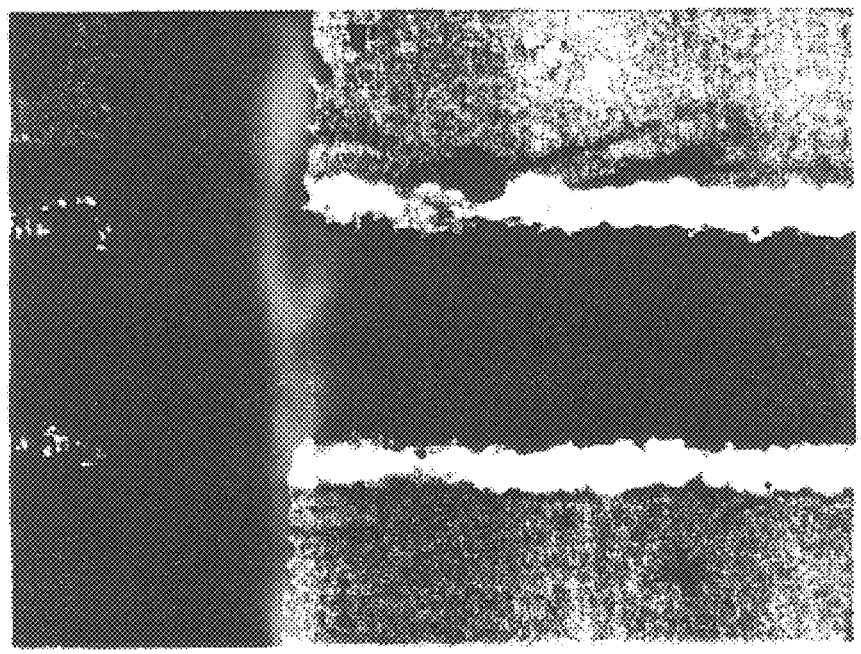
FIGS. 5A and 5B are photographs showing scribed patterns formed by the method shown in FIGS. 4A to 4C.
Figure 5B:
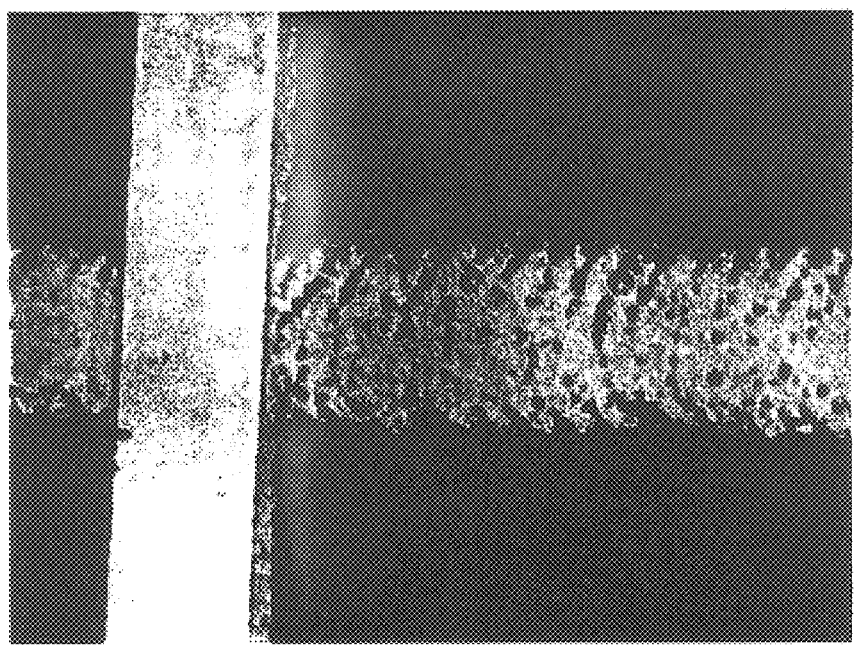

When the trench 23a is formed in the metal back electrode layer 5 as described above, a trench 23b as shown in FIGS. 4C, 5A, and 5B is usually formed in the thin-film photovoltaic semiconductor layer 4. FIGS. 5A and 5B are photographs showing examples of the trench 23a formed by irradiating an Ag metal back electrode layer 5 with the third harmonic of a YAG laser from the film surface side (output= 0.6 W, frequency=5 kHz, and width of metal back electrode layer 5=98 µm).

The width of this trench 23b varies in accordance with the materials of the individual layers, the laser power, the beam diameter, the relative velocity between the substrate 2 and the optical axis of a laser beam, and the like. In any case, the width of the trench 23b is smaller than that of the trench 23a. Conversely, in the method according to the prior art the metal back electrode layer 5 is divided by using sublimation of the photovoltaic semiconductor layer 4, so the width of a trench formed in the photovoltaic semiconductor layer 4 is equal to or larger than the width of a trench formed in the metal back electrode layer 5. That is, this method is characterized in that the width of the trench 23b is smaller than that of the trench 23a.

Although the width of the trench 23b varies as described above, it is usually 0% to 95% of the width of the trench 23a. Also, in FIG. 4C the bottom surface of the trench 23b is the top surface of the transparent front electrode layer 3. However, the bottom surface of the trench 23b need not reach the transparent front electrode layer 3.

After the trench 23a is formed as above, reactive ion etching or wet etching can also be performed. This more reliably prevents an electric short circuit between adjacent metal back electrode layers 5. As already explained in the first embodiment, electrode bus bars 12 and the like are usually attached to the module 1 formed by the above method.

In the first fabrication method of this embodiment as described above, the metal back electrode layer 5 is divided by irradiating the electrode layer 5 with a laser beam having a wavelength of 400 nm or less from the back surface. In contrast to this, in the second fabrication method of this embodiment described below, the metal back electrode layer 5 is divided by forming on this electrode layer 5 a light-absorbing layer containing a subliming material which absorbs a laser beam having a wavelength of 600 nm or less at a higher efficiency than that of the material of the electrode layer 5, and by using sublimation of the subliming material in a laser-irradiated portion of the light-absorbing layer produced when this light-absorbing layer is irradiated with a laser beam from the back surface.

Figure 6A:
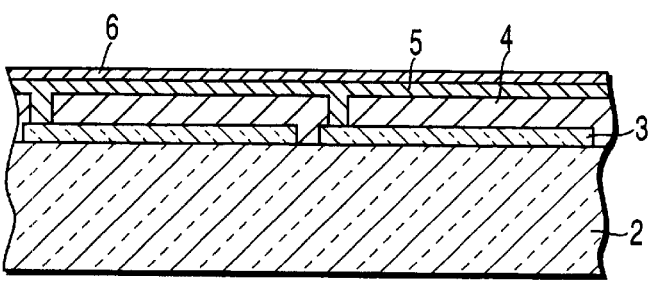
FIGS. 6A and 6B are sectional views schematically showing the second fabrication process of the thin-film photovoltaic module according to the fourth embodiment of the present invention.
Figure 6B:
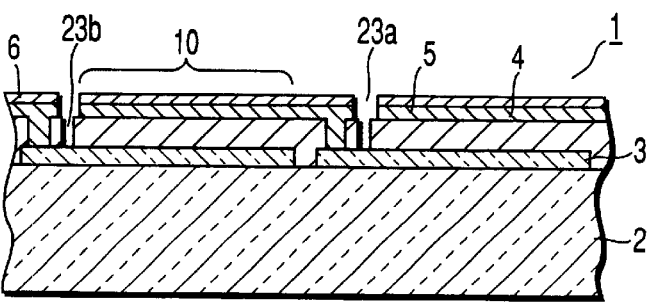

FIGS. 6A and 6B are sectional views schematically showing the second fabrication process of the thin-film photovoltaic module 1 according to the fourth embodiment of the present invention. The module 1 is shown in FIG. 6B.

This module 1 shown in FIG. 6B is obtained by, e.g., the second fabrication method described below.

First, a structure shown in FIG. 4B is obtained by performing the steps explained with reference to FIGS. 4A and 4B in the first fabrication process.

Next, as shown in FIG. 6A, a light-absorbing layer 6 is formed on a metal back electrode layer 5. This light-absorbing layer 6 contains a subliming material which absorbs a laser beam having a wavelength of 600 nm or less, e.g., a laser beam conventionally extensively used in the fabrication of the module 1, at a higher efficiency than that of the material of the metal back electrode layer 5.

Therefore, in the second fabrication method of this embodiment, even when a conventionally used laser beam is used, it is possible to suppress reflection of the laser beam emitted from the film surface side and heat to a temperature high enough to divide the metal back electrode layer 5.

Examples of the subliming material forming the light-absorbing layer 6 are titanium, chromium, tungsten, magnesium, silicon oxide, aluminum oxide, and zinc oxide. The light absorbance of the subliming material forming the light-absorbing layer 6 with respect to a laser beam having a wavelength of 400 to 600 nm is preferably 0.1 or more. When this is the case, the metal back electrode layer 5 can be efficiently divided by using the existing installation. Also, the light-absorbing layer 6 is preferably conductive because it is formed on the metal back electrode layer 5.

The light-absorbing layer 6 described above can be formed by vapor deposition or sputtering. This light-absorbing layer 6 is commonly formed to have a thickness of about 10 to 200 nm.

After the light-absorbing layer 6 is formed, as shown in FIG. 6B, a trench 23a is formed in the metal back electrode layer 5 by laser scribing to electrically insulate the electrode layer 5 between cells 10. In the second fabrication method of this embodiment as described above, the light-absorbing layer 6 which absorbs a laser beam having a wavelength of 600 nm or less at a higher efficiency than that of the metal back electrode layer 5 is formed on this metal back electrode layer 5. Hence, in this method the trench 23a can be formed by emitting a laser beam having a wavelength of 600 nm or less from the film surface side.

A laser beam source used in the formation of the trench 23a in this second fabrication method is not particularly limited as long as it outputs a laser beam having a wavelength of 600 nm or less. This laser beam source can be any of a solid-state laser, a liquid laser, and a gas laser such as an excimer laser or a nitrogen laser. Usually, a laser beam source which outputs a laser beam having a wavelength of 500 nm or more is used. An example of this laser beam used in the formation of the trench 23a is the second harmonic of a solid-state laser containing yttrium such as YAG.

The power and beam diameter of a laser beam used in the formation of the trench 23a, the relative velocity between the substrate 2 and the optical axis of the laser beam, and the like change in accordance with, e.g., the materials and thicknesses of the metal back electrode layer 5 and the light-absorbing layer 6 and the width of the trench 23a formed. Generally, the power, frequency, and beam diameter of a laser beam are 0.4 to 4 W, 5 to 50 kHz, and 30 to 100 µm, respectively, and the relative velocity between the substrate 2 and the optical axis of the laser beam is 100 to 1,000 mm/sec. When this is the case, the trench 23a can be formed to have a width of 30 to 100 µm.

When the trench 23a is formed in the metal back electrode layer 5 as described above, a trench 23b as shown in FIG. 6B is usually formed in the thin-film photovoltaic semiconductor layer 4. In any case, the width of the trench 23b is smaller than that of the trench 23a, as explained in the first fabrication method. The width of the trench 23b is usually 0% to 95% of the width of the trench 23a. Also, in FIG. 6B the bottom surface of the trench 23b is the top surface of the transparent front electrode layer 3. However, the bottom surface of the trench 23b need not reach the transparent front electrode layer 3.

Figure 7A:
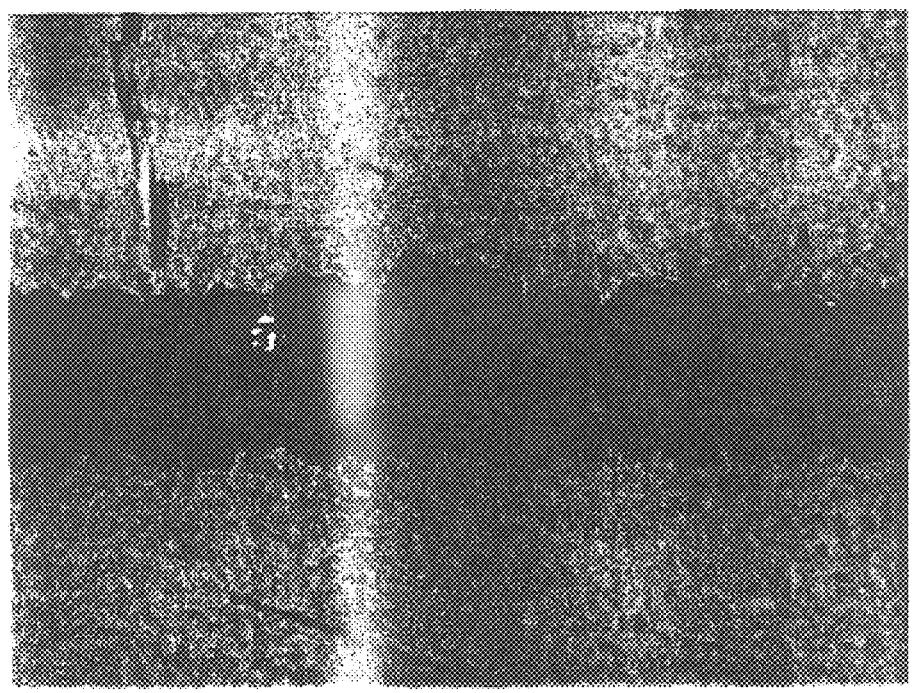
FIGS. 7A and 7B are photographs showing scribed patterns formed by the method shown in FIGS. 6A and 6B.
Figure 7B:
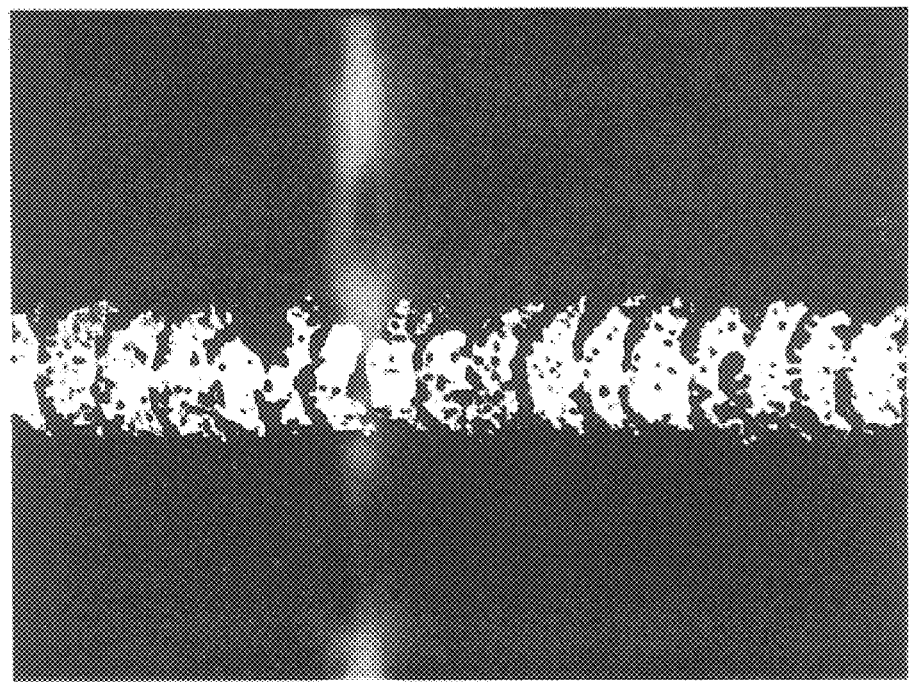

FIGS. 7A and 7B are photographs showing examples of the trench 23a formed by emitting the third harmonic of a YAG laser from the film surface side when the light-absorbing layer 6 is formed by Ti (output=0.4 W, frequency=5 kHz, and width of metal back electrode layer 5=70 µm).

After the trench 23a is formed as above, reactive ion etching or wet etching can also be performed. This more reliably prevents an electric short circuit between adjacent metal back electrode layers 5.

The first and second fabrication methods described above relate to the structure in which the transparent electrode layer 3, the photovoltaic semiconductor layer 4 having a p-i-n junction, and the metal electrode layer 5 are sequentially stacked on the transparent substrate 2. However, some other structure can also be used. For example, when the thin-film photovoltaic semiconductor layer 4 is formed as a tandem type, the thickness of the metal back electrode layer 5 increases, so the above methods are more effectively applicable. Also, in each of the above methods the cells 10 are connected in series, but these cells 10 can also be connected in parallel.

In the fourth embodiment of the present invention as described above, a metal back electrode layer is divided by emitting a laser beam from the film surface side. Accordingly, even if defects are present in a transparent substrate, they do not interfere with the division of the metal back electrode layer. Additionally, it is unnecessary to reverse the transparent substrate so that the film surface faces down when the metal back electrode layer is divided. In this embodiment, therefore, not only the effects explained in the first embodiment can be obtained, but also satisfactory module performance can be obtained or the fabrication yield of the module can be increased. Note that these additional effects can be obtained without temperature control of the substrate 2 explained in the first embodiment. That is, the technique explained in this fourth embodiment is very useful in this field of art without ever being combined with the technique explained in the first embodiment.

The fifth embodiment of the present invention will be described below. The technique to be explained in this embodiment can be combined with any of the first to fourth embodiments. Therefore, in this embodiment only the difference from the first to fourth embodiments will be described.

Conventionally, in the fabrication of a module 1, laser scribing of a thin film such as a transparent front electrode layer 3 is performed by, e.g., the following method. First, a substrate 2 is horizontally moved in a first direction while a thin film formed on this substrate 2 is vertically irradiated with a laser beam, and the irradiation by the laser beam is stopped at an appropriate timing by a shutter or the like. Consequently, one trench is formed in the thin film. Next, the substrate 2 is horizontally moved in a second direction perpendicular to the first direction such that the optical axis of the laser beam is positioned apart from the formed trench by a predetermined distance. After that, the substrate 2 is horizontally moved in the opposite direction to the first direction while the shutter is opened to irradiate the thin film formed on the substrate 2 with the laser beam, and the irradiation with the laser beam is stopped at an appropriate timing by the shutter or the like. Consequently, a trench parallel to the previously formed trench is formed in the thin film. In the fabrication of the module 1, trenches are formed in a thin film such as the transparent front electrode layer 3 by repeating this operation.

In this laser scribing method as described above, the shutter must be opened/closed whenever one trench is formed. Hence, this method cannot successively form trenches, so high productivity is difficult to realize.

In contrast to this, in this embodiment a plurality of trenches are successively formed without opening/closing a shutter whenever one trench is formed. That is, in this embodiment the following steps are successively performed while irradiating a thin film formed on a substrate 2 with a laser beam: moving the substrate 2 in a first direction relative to the optical axis of the laser beam; moving the substrate 2 in a second direction crossing the first direction relative to the optical axis of the laser beam; and moving the substrate 2 in a third direction opposite to the first direction relative to the optical axis of the laser beam. Note that the first to third directions are parallel to the principal surface of the substrate 2. The relative movement of the substrate 2 in the first and third directions with respect to the optical axis of a laser beam is performed such that the laser beam irradiates a portion of a power generation region. The relative movement of the substrate 2 in the second direction with respect to the optical axis of a laser beam is performed such that the laser beam irradiates the outside of the power generation region.

As described earlier, the power generation region and a peripheral region are insulated by a trench 25. That is, the peripheral region does not contribute to the photovoltaic function of the module 1. Therefore, the output characteristics of the module 1 are unaffected regardless of whatever trench is formed in this peripheral region. On the basis of this finding, in this embodiment a plurality of trenches can be successively formed without opening/closing a shutter whenever one trench is formed.

A method of fabricating the module 1 according to the fifth embodiment will be described in more detail below. The fabrication method according to this embodiment is identical with the first to fourth embodiments except for a laser scribing step. Therefore, this laser scribing step will be primarily explained below.

First, a laser scriber used in the method of fabricating the module 1 according to the fifth embodiment will be described.

Figure 8:
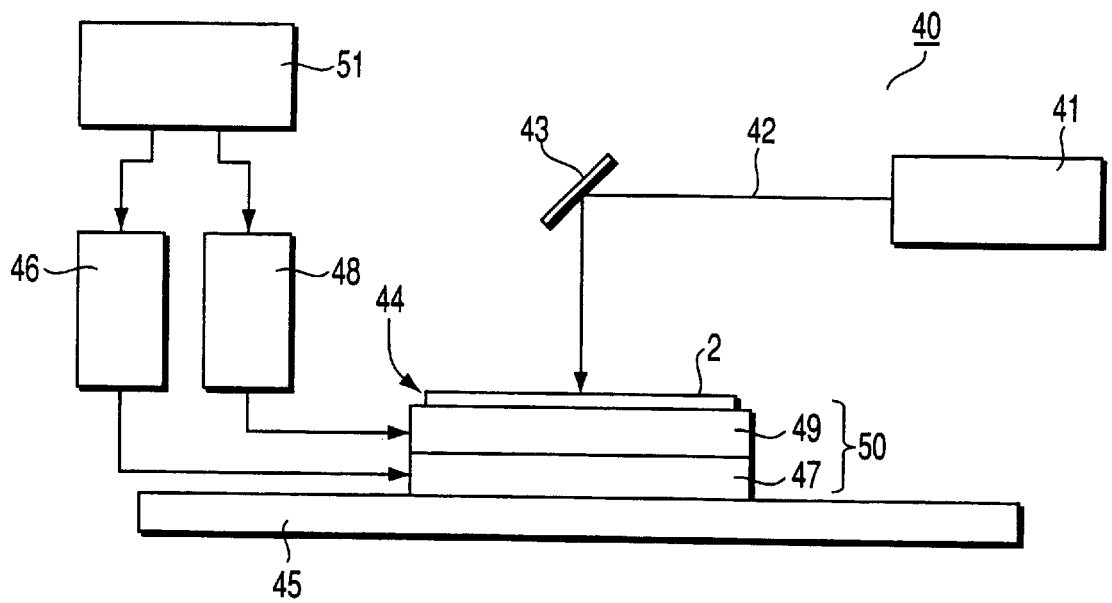
FIG. 8 is a view schematically showing a laser scriber used in a method of fabricating a thin-film photovoltaic module according to the fifth embodiment of the present invention.

FIG. 8 is a view schematically showing the laser scriber used in the method of fabricating the thin-film photovoltaic module 1 according to the fifth embodiment of the present invention. A laser scriber 40 shown in FIG. 8 has a laser oscillator 41. A reflecting mirror 43 reflects an output laser beam 42 from the laser oscillator 41 to change the optical path of this laser beam 42.

An X-Y oscillator 44 is placed in the propagating direction of the laser beam 42 reflected by the reflecting mirror 43. This X-Y oscillator 44 has a base 45. An X table 47 is mounted on this base 45, and a Y table 49 is mounted on the X table 47. A driving source 46 drives the X table 47 in the X direction. A driving source 48 drives the Y table 49 in the Y direction on the X table 47. That is, the Y table 49 can be driven in both the X and Y directions on the base 45. These X and Y tables 47 and 49 constitute an X-Y table 50. The X and Y directions are parallel to the upper surface of the base 45 and perpendicular to each other.

The driving sources 46 and 48 are connected to a controller 51. This controller 51 is, e.g., a computer, and controls power supply to the driving sources 46 and 48 and the like on the basis of preset programs. That is, the controller 51 controls the operations of the X and Y tables 47 and 49 on the basis of the preset programs.

A substrate 2 on which a thin film such as a transparent electrode layer 3 is formed is placed on the Y table 49. A lens (not shown) is inserted between the reflecting mirror 43 and the substrate 2 to align the focal position of the laser beam 42 with the position of a thin film to be divided.

Figure 9:
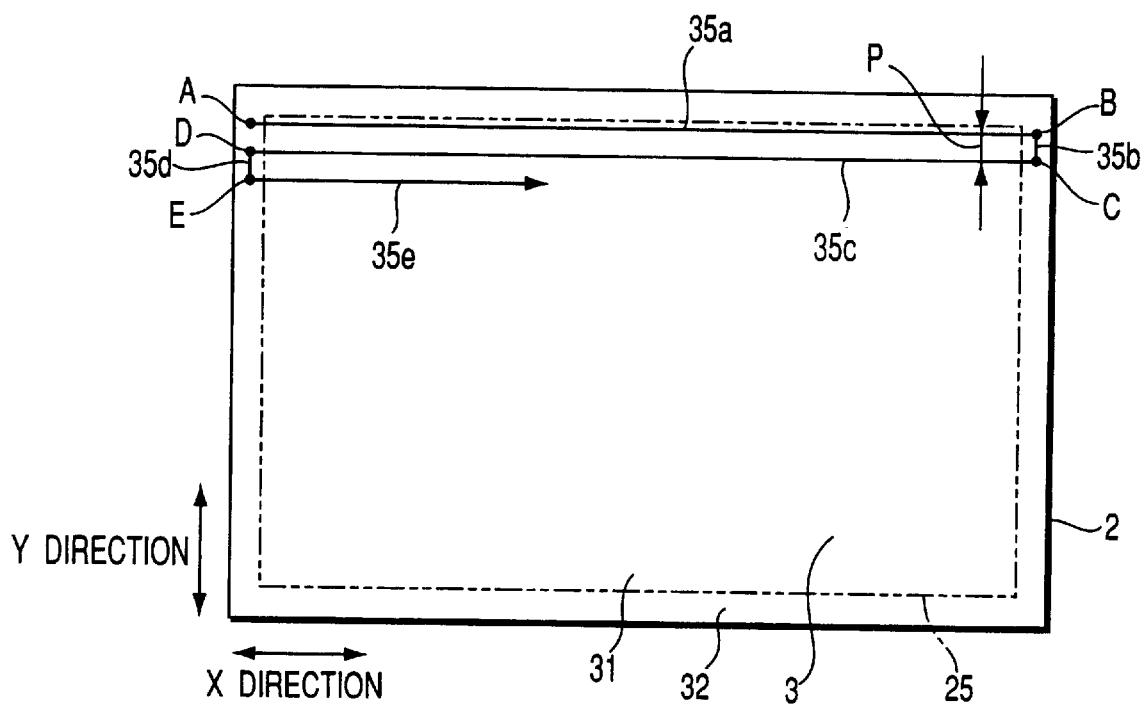
FIG. 9 is a plan view schematically showing the first laser scribing method in the fabrication of the thin-film photovoltaic module according to the fifth embodiment of the present invention.

In the method according to the fifth embodiment, the above laser scriber 40 is used to form trenches in a thin film as explained below. The first method will be described with reference to FIGS. 8 and 9. FIG. 9 is a plan view schematically showing the first laser scribing method in the fabrication of a thin-film photovoltaic module according to the fifth embodiment of the present invention. Referring to FIG. 9, the X direction indicates the moving direction of the X table 47 with respect to the base 45, and the Y direction indicates the moving direction of the Y table 49 with respect to the X table 47.

First, a substrate 2 on one entire principal surface of which a transparent front electrode layer 3 is formed is prepared. This substrate 2 is placed on the Y table 49 such that the electrode layer 3 faces the reflecting mirror 43. After that, the Y table 49 is driven to align the substrate 2 so that the output laser beam from the laser oscillator 41 irradiates a point A shown in FIG. 9. Note that this point A is positioned in a peripheral region 32 insulated from a power generation region 31 by a trench 25 formed in a later step. Note also that the position of this point A in the Y direction is between two sides, parallel to the X direction, of the trench 25 and closer to one of them.

After the substrate 2 is so aligned that the point A is positioned on the optical axis of the laser beam 42, the X driving source 46 is operated to move the X table 47 in the X direction (forward direction). Consequently, laser scribing is performed for the transparent front electrode layer 3 along a line 35a, forming a trench 21 in this transparent front electrode layer 3 along the line 35a.

At the time the laser beam 42 irradiates a point B, the movement of the X table 47 is stopped without shutting off the laser beam 42, and subsequently the Y table 49 is moved a distance P in the Y direction. That is, the Y table 49 is moved until the laser beam 49 irradiates a point C. With this operation, a trench is formed in the transparent front electrode layer 3 along a line 35b. Since this trench is positioned inside the peripheral region 32, the trench has no adverse effect on the output characteristics of the module 1.

Next, at the time the laser beam 42 irradiates the point C, the movement of the Y table 49 is stopped, and subsequently the X table 47 is moved in the reverse direction without shutting off the laser beam 42. That is, laser scribing is performed for the transparent front electrode layer 3 along a line 35c. Consequently, a trench 21 is formed in this transparent front electrode layer 3 along the line 35c.

At the time the laser beam 42 irradiates a point D, the movement of the X table 47 is stopped without shutting off the laser beam 42, and subsequently the Y table 49 is moved the distance P in the Y direction. That is, the Y table 49 is moved until the laser beam 49 irradiates a point E. With this operation, a trench is formed in the transparent front electrode layer 3 along a line 35d. Since this trench is positioned inside the peripheral region 32, the trench has no adverse effect on the output characteristics of the module 1.

Next, at the time the laser beam 42 irradiates the point E, the movement of the Y table 49 is stopped, and subsequently the X table 47 is moved in the forward direction without shutting off the laser beam 42. That is, laser scribing is performed for the transparent front electrode layer 3 along a line 35e. Consequently, a trench 21 is formed in this transparent front electrode layer 3 along the line 35e.

By repeating this operation, a plurality of trenches 21 parallel to the X direction can be formed at the pitch P in the transparent front electrode layer 3.

In the first laser scribing method of this embodiment as described above, all the trenches 21 can be formed by continuously scanning the laser beam 42 on the transparent front electrode layer 3 without interrupting the emission of the laser beam 42. Therefore, these trenches 21 can be completely formed within a shorter time period than when a shutter is opened/closed each time one trench 21 is formed. That is, the first laser scribing method of this embodiment can reduce the time required for the laser scribing step.

Especially in the fabrication process of the module 1, trenches are formed in the thin-film photovoltaic semiconductor layer 4 and the metal back electrode layer 5, as well as in the transparent front electrode layer 3. In addition, as the size of the module 1 increases, the number of trenches formed usually increases. Hence, the effect of the first laser scribing method of this embodiment greatly helps improve the productivity of the module 1.

In the first laser scribing method described above, the lines 35b and 35d are positioned inside the peripheral region 32. That is, in the above first laser scribing method, the laser beam 42 irradiates the peripheral region 32 when the substrate 2 is moved in the Y direction. This method is particularly effective when the spacing between the trench 25 and the edge of the substrate 2 is sufficiently wide. On the other hand, when the spacing between the trench 25 and the edge of the substrate 2 is narrow, the use of the second laser scribing method explained below is preferred.

Figure 10:
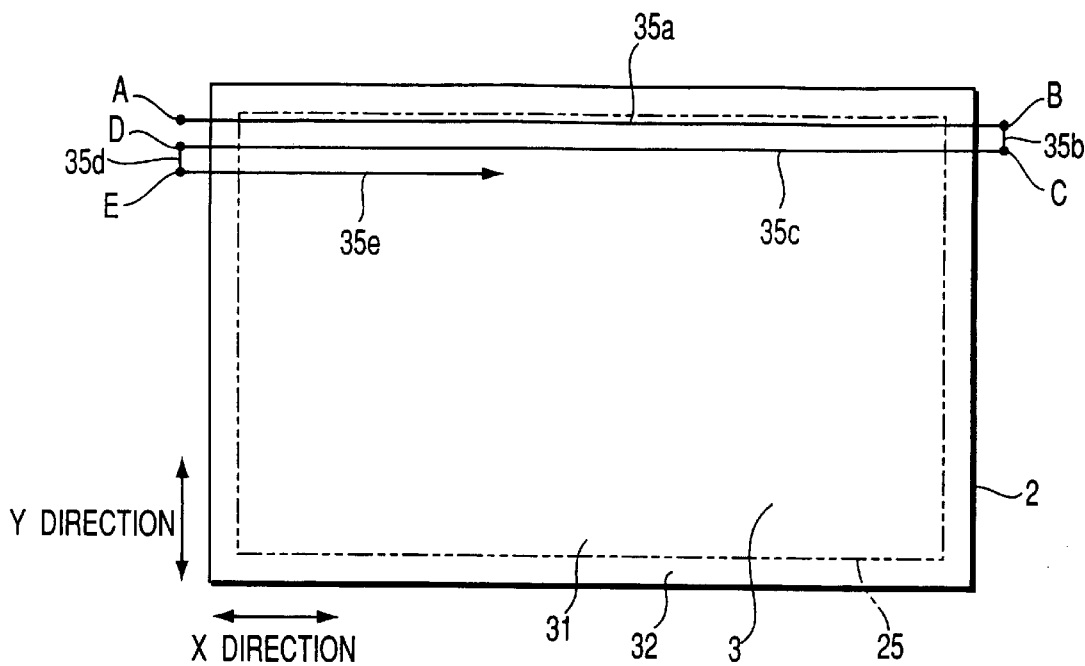
FIG. 10 is a plan view schematically showing the second laser scribing method in the fabrication of the thin-film photovoltaic module according to the fifth embodiment.

FIG. 10 is a plan view schematically showing the second laser scribing method in the fabrication of the thin-film photovoltaic module according to the fifth embodiment of the present invention. In this second laser scribing method, the lines 35b and 35d are not positioned on the substrate 2. That is, in the second laser scribing method the laser beam 42 irradiates a region outside the substrate 2 when the substrate 2 is moved in the Y direction. This method does not require any high accuracy for the movement in the X direction of the substrate 2. Accordingly, the trenches 21 can be reliably formed even when the spacing between the trench 25 and the edge of the substrate 2 is narrow.

In the first and second laser scribing methods, laser scribing is performed for the transparent front electrode layer 3. Laser scribing can also be performed for the thin-film photovoltaic semiconductor layer 4 and the metal back electrode layer 5 by a similar method. Also, as described previously, laser scribing of the metal back electrode layer 5 can be performed by an indirect method which uses sublimation occurring when the thin-film photovoltaic semiconductor layer 4 is irradiated with the laser beam 42 from the transparent substrate 2 side, or by a direct method by which the metal back electrode layer 5 is irradiated with the laser beam 42 from the film surface side. Furthermore, in the first and second laser scribing methods, the substrate 2 is moved with respect to the optical axis of the laser beam 42. However, the optical axis of the laser beam 42 can also be moved with respect to the substrate 2.

In the fifth embodiment of the present invention as described above, a plurality of trenches are successively formed without opening/closing a shutter whenever one trench is formed. Therefore, in this fifth embodiment of the present invention, not only the effects explained in the first to fourth embodiments can be obtained, but also it is possible to reduce the time required for the laser scribing step and thereby improve the productivity of the module 1. Note that these additional effects can be obtained without temperature control of the substrate 2 explained in the first embodiment. Likewise, these additional effects of the fifth embodiment can be obtained without combining this fifth embodiment with the second to fourth embodiments. That is, the technique explained in this fifth embodiment is very useful in this field of art without ever being combined with the techniques explained in the first to fourth embodiments.

In the first to fifth embodiments described above, the module 1 has a structure in which a plurality of cells 10 are connected in series. However, this module 1 can also have a structure in which these cells 10 are connected in parallel.

Also, the module 1 explained in the first to fifth embodiments has a structure in which the transparent electrode layer 3, the photovoltaic semiconductor layer 4, and the metal electrode layer 5 are stacked in this order from the substrate 2 side. However, in the first to third and fifth embodiments, the module 1 can also have a structure in which the metal electrode layer 5, the photovoltaic semiconductor layer 4, and the transparent electrode layer 3 are stacked in this order from the substrate 2 side. If this is the case, the substrate 2 need not, of course, be light-transmitting.

Examples of the present invention will be described below.

EXAMPLE 1

A module 1 shown in FIGS. 2 and 3 was manufactured by the following method. In this example, a series array 11 is composed of forty-eight thin-film photovoltaic cells 10.

First, a glass substrate 2 on one principal surface of which an $SnO_2$ transparent electrode layer 3 was formed was prepared. This glass substrate 2 had dimensions of 460 mm×920 mm, and its dimensional accuracy was ±2 mm. The glass substrate 2 was loaded into a clean room controlled at a temperature of 25° C. and placed on an X-Y table of a laser scriber. After that, the transparent electrode layer 3 was laser-scribed by using the fundamental wave of a Q-switched YAG laser having a frequency of 10 kHz and an average output of 3 W. Consequently, trenches 21 about 40 μm wide and a pair of alignment marks 30 were formed in the transparent electrode layer 3.

Next, an inline type plasma CVD apparatus was used to sequentially form a p-type silicon layer, an i-type silicon layer, and an n-type silicon layer on the surface of the glass substrate 2 on which the transparent electrode layer 3 was formed, thereby obtaining a thin-film photovoltaic semiconductor layer 4 having a p-i-n junction. Note that the substrate temperature was kept at 200° C. while the thin-film photovoltaic semiconductor layer 4 was formed using the CVD apparatus.

The glass substrate 2 unloaded from the CVD apparatus was again placed on the X-Y table of the laser scriber. X-Y correction and θ correction were performed using this X-Y table with reference to the alignment marks 30 formed at the corners of the substrate 2. After that, the photovoltaic semiconductor layer 4 was laser-scribed by using the second harmonic of a Q-switched YAG laser having a frequency of 10 kHz and an average output of 0.8 W. In this manner, trenches 22 about 80 μm thick were formed in the photovoltaic semiconductor layer 4. Note that this laser scribing of the photovoltaic semiconductor layer 4 was performed such that the laser beam irradiated a position about 150 μm apart from the trench 21 at the start of scribing.

Next, the substrate 2 having the photovoltaic semiconductor layer 4 and the like, a ZnO target, and an Ag target were set in a magnetron sputtering apparatus. After that, an argon gas pressure and the substrate temperature were set to 2 mTorr and 200° C., respectively, and the ZnO target was sputtered by RF discharge with a discharge power of 200 W. Consequently, a 1,000-Å thick ZnO layer (not shown) was formed on the surface of the substrate 2 on which the photovoltaic semiconductor layer 4 was formed. Subsequently, the argon gas pressure and the film formation temperature were set to 2 mTorr and room temperature, respectively, and the Ag target was sputtered by DC discharge with a discharge power of 200 W. As a consequence, a 2,000-Å thick Ag layer 5 was formed on the ZnO layer.

The glass substrate 2 unloaded from the magnetron sputtering apparatus was again placed on the X-Y table of the laser scriber. X-Y correction and θ correction were performed using this X-Y table with reference to the alignment marks 30 formed at the corners of the substrate 2. After that, the ZnO layer and the Ag layer 5 were laser-scribed by using the second harmonic of a Q-switched YAG laser having a frequency of 10 kHz and an average output of 0.8 W. In this manner, trenches 23 about 80 μm wide were formed in the ZnO layer and the Ag layer 5. Note that this laser scribing of the ZnO layer and the Ag layer 5 was performed such that the laser beam irradiated a position about 300 μm apart from the trench 21 at the start of scribing.

Finally, trenches 24 and 25 were formed, and electrode bus bars 12 and lines (not shown) for extracting electrodes were connected. In this way the module 1 was fabricated.

In the above process, the substrate 2 was at high temperature immediately after it was unloaded from the CVD apparatus when the formation of the photovoltaic semiconductor layer 4 was complete, and was cooled to room temperature with the passing of time. The scribing step for forming the trenches 22 was performed by changing the standing time during which the substrate 2 unloaded from the CVD apparatus was left to stand before being set in the laser scriber from 10 to 40 min. That is, the scribing step for forming the trenches 22 was performed under a plurality of conditions differing in temperature of the substrate 2. Note that scanning patterns for forming the trenches 21 to 23 were determined by taking the size of the substrate 2 at room temperature (25° C.) into consideration. Note also that the temperature of the substrate 2 when the transparent electrode 3 was scribed was 25° C. The temperature of this glass substrate 2 was measured using a surface thermometer.

Figure 11A:
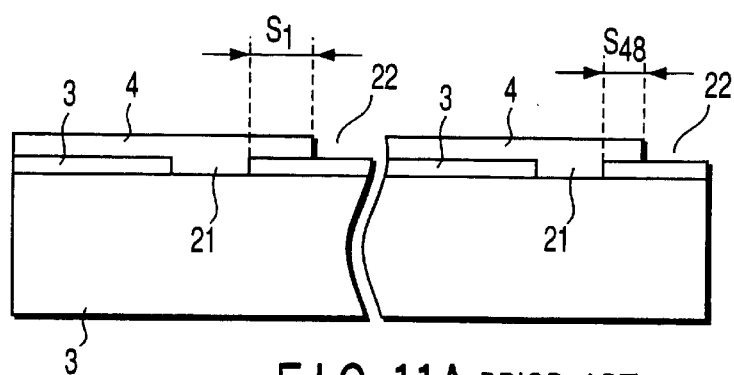
FIG. 11A is a view schematically showing a scribed pattern formed by a conventional thin-film photovoltaic module fabrication method according to Example 1.
Figure 11B:
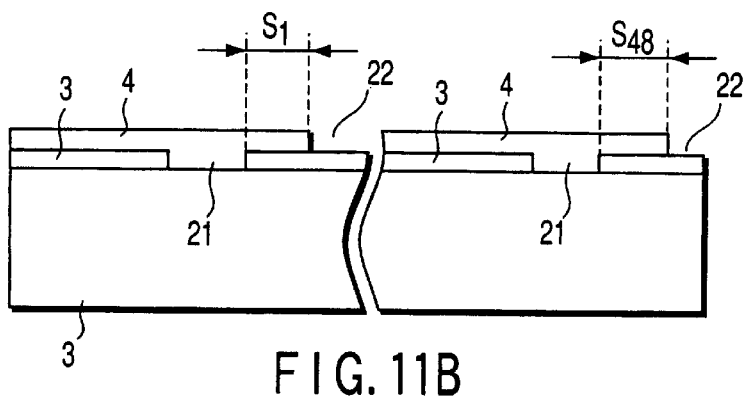
FIG. 11B is a view schematically showing a scribed pattern formed by the conventional thin-film photovoltaic module fabrication method according to Example 1.

A plurality of modules 1 were fabricated by the above method. For each of these modules 1, the difference (S1–S2) between a spacing S1 between the trenches 21 and 22 at the scribing start position and a spacing S2 between them at the scribing end position was calculated. The results are shown in the following table. Additionally, FIG. 11A shows the structure obtained by forming the trenches 22 when the temperature of the substrate 2 was 50° C. FIG. 11B shows the structure obtained by forming the trenches 22 when the temperature of the substrate 2 was 28 to 29° C.

| Standing time (min) | Temperature of substrate 2 (° C.) | S1–S48 (μm) |
|---|---|---|
| 10 | 50 | 62 |
| 20 | 36–37 | 28 |
| 30 | 33–34 | 17 |
| 40 | 28–29 | 8 |

As is apparent from the above table and FIGS. 11A and 11B, the higher the temperature of the substrate 2 during scribing of the photovoltaic semiconductor layer 4, the larger the difference (S1–S2). This is so primarily because the trenches 21 were formed as designed, whereas the trenches 22 were formed with narrower spacings between them owing to thermal expansion of the substrate 2 when the temperature of the substrate 2 was high during scribing of the photovoltaic semiconductor layer 4. Generally, the allowable value of the difference (S1–S2) is about 20 μm. Therefore, when the target temperature in determination of scanning patterns is set at room temperature (25° C.), the temperature of the substrate 2 during scribing is controlled to 35° C. or less, i.e., the difference between the temperature of the substrate 2 during scribing and the target temperature is controlled to 10° C. or less. Consequently, scribing of the photovoltaic semiconductor layer 4 can be performed with high accuracy.

Note that in the scribing step for the ZnO layer and the Ag layer 5, the temperature of the substrate 2 was substantially room temperature (25° C.) regardless of the standing time during which the substrate 2 unloaded from the sputtering apparatus was left to stand before being set in the laser scriber. Accordingly, the trenches 23 could be formed with high accuracy. However, if the sputtering conditions of the ZnO layer and the Ag layer 5 were changed, it is necessary to set a new target temperature and determine scanning patterns by taking account of the size of the substrate 2 at that target temperature.

EXAMPLE 2

A module 1 shown in FIGS. 2 and 3 was fabricated by the following method.

First, $SnO_2$ was deposited on one entire principal surface of a glass substrate 2 to form a transparent electrode layer 3. This transparent electrode layer 3 was laser-scribed by using a multi mode of the fundamental wave of a Q-switched YAG laser to form trenches 21. This laser scribing was performed with an oscillation frequency of 10 kHz, an average output of 3 W, and a pulse width of 50 nsec. The width of each of these trenches 21 was 50 μm, and the distance between the trenches 21 was 10 mm.

Next, on the surface of the substrate 2 on which the electrode layer 3 was formed, a 150-Å thick p-type a-SiC:H layer, a 3,200-Å thick i-type a-Si:H layer, and a 300-Å thick n-type a-Si:H layer were sequentially stacked by plasma CVD, thereby obtaining a thin-film photovoltaic semiconductor layer 4. This photovoltaic semiconductor layer 4 was laser-scribed by using a single mode of the second harmonic of a Q-switched YAG laser to form trenches 22. This laser scribing was performed with an oscillation frequency of 10 kHz, an average output of 1 W, and a pulse width of 50 nsec.

After that, a metal back electrode layer 5 was formed on the surface of the substrate 2 on which the photovoltaic semiconductor layer 4 was formed. This electrode layer 5 was laser-scribed by using a single mode of the second harmonic of a Q-switched YAG laser to form trenches 23. This laser scribing was performed with an oscillation frequency of 10 kHz, an average output of 1 W, and a pulse width of 50 nsec. The width of each of these trenches 23 was 100 μm, and the distance between the trenches 23 was 10 mm.

Next, the photovoltaic semiconductor layer 4 and the electrode layer 5 were laser-scribed by using a single mode of the second harmonic of a Q-switched YAG laser to form trenches 24. This laser scribing was performed with an oscillation frequency of 10 kHz, an average output of 1 W, and a pulse width of 50 nsec. Also, the electrode layer 3, the photovoltaic semiconductor layer 4, and the electrode layer 5 were laser-scribed by using a multi mode of the fundamental wave of a Q-switched YAG laser to form trenches 25.

Finally, solder-plated copper foils 12 were attached to the electrode layer 3 exposed in the trenches 24 by ultrasonic solder 13. In this manner the module 1 was fabricated.

In this example, scanning patterns for forming the trenches 21 to 23 were determined by taking into account the size of the substrate 2 at room temperature (25° C.), and the temperature of the substrate 2 during each scribing was also 25° C. Therefore, in this example the trenches 21 to 23 could be formed as designed.

EXAMPLE 3

A module 1 shown in FIGS. 2 and 3 was fabricated by the following method.

First, $SnO_2$ was deposited on one entire principal surface of a glass substrate 2 to form a transparent electrode layer 3. This transparent electrode layer 3 was laser-scribed by using the fundamental wave of a Q-switched YAG laser to form trenches 21. This laser scribing was performed with an oscillation frequency of 5 kHz, an average output of 1 W, and a pulse width of 120 nsec. The width of each of these trenches 21 was 50 μm, and the distance between the trenches 21 was 9 mm.

Next, on the surface of the substrate 2 on which the electrode layer 3 was formed, a 150-Å thick p-type a-SiC:H layer, a 3,200-Å thick i-type a-Si:H layer, and a 300-Å thick n-type a-Si:H layer were sequentially stacked by plasma CVD, thereby obtaining a thin-film photovoltaic semiconductor layer 4. This photovoltaic semiconductor layer 4 was laser-scribed by using the second harmonic of a Q-switched YAG laser to form trenches 22. This laser scribing was performed with an oscillation frequency of 5 kHz, an average output of 0.5 W, and a pulse width of 120 nsec.

After that, a metal back electrode layer 5 was formed on the surface of the substrate 2 on which the photovoltaic semiconductor layer 4 was formed. This electrode layer 5 was laser-scribed by using the third harmonic of a Q-switched YAG laser to form trenches 23. This laser scribing was performed with an oscillation frequency of 5 kHz, an average output of 0.5 W, and a pulse width of 120 nsec. The width of each of these trench 23 was 100 μm, and the distance between the trenches 23 was 9 mm.

Next, the photovoltaic semiconductor layer 4 and the electrode layer 5 were laser-scribed by using the second harmonic of a Q-switched YAG laser to form trenches 24. This laser scribing was performed with an oscillation frequency of 5 kHz, an average output of 0.5 W, and a pulse width of 120 nsec.

Also, the electrode layer 3, the photovoltaic semiconductor layer 4, and the electrode layer 5 were laser-scribed by using the third harmonic of a Q-switched YAG laser to form trenches 25. This laser scribing was performed with an oscillation frequency of 5 kHz, an average output of 1.5 W, and a pulse width of 120 nsec. The width of each of these trenches 25 was 200 μm.

Finally, solder-plated copper foils 12 were attached to the electrode layer 3 exposed in the trenches 24 by ultrasonic solder 13. In this manner the module 1 was fabricated.

In this example, scanning patterns for forming the trenches 21 to 23 were determined by taking into account the size of the substrate 2 at room temperature (25° C.), and the temperature of the substrate 2 during each scribing was also 25° C. Therefore, in this example the trenches 21 to 23 could be formed as designed.

EXAMPLE 4

A thin-film photovoltaic module 1 shown in FIGS. 2 and 3 was fabricated by the method shown in FIGS. 4A to 4C.

First, as shown in FIG. 4A, the first harmonic of a YAG laser was used to perform laser scan from the film surface side of a glass substrate 2 in a direction parallel to its long sides, thereby scribing an $SnO_2$ film 3 formed on one principal surface of the glass substrate 2 to form a plurality of trenches 21. The formation of these trenches 21 was done by setting the laser beam power to 3 W, the frequency to 10 kHz, the beam diameter to 50 µm, and the relative velocity between the substrate 2 and the optical axis of the laser beam to 200 mm/sec.

Next, a 10-nm thick p-type hydrogenated amorphous silicon carbide layer, a 300-nm thick i-type hydrogenated amorphous silicon layer, and a 10-nm thick hydrogenated crystallite silicon layer were sequentially formed on the $SnO_2$ layer 3 by plasma CVD. Note that the p-type hydrogenated amorphous silicon carbide layer was doped with boron as an impurity, the i-type hydrogenated amorphous silicon layer was nondoped, and the n-type hydrogenated crystallite silicon layer was doped with phosphorus. In this way, a thin-film photovoltaic semiconductor layer 4 having a p-i-n junction was formed.

After that, as shown in FIG. 4A, the second harmonic of a YAG laser was used to perform laser scan from the film surface side of the substrate 2 in the direction parallel to its long sides, thereby scribing this thin-film photovoltaic semiconductor layer 4 to form a plurality of trenches 22 in it. The formation of these trenches 22 was done by setting the laser beam power to 1 W, the frequency to 10 kHz, the beam diameter to 80 µm, and the relative velocity between the substrate 2 and the optical axis of the laser beam to 400 mm/sec.

Next, as shown in FIG. 4B, a 100-nm thick ZnO film (not shown) and a 300-nm thick Ag film 5 were sequentially formed on the thin-film photovoltaic semiconductor layer 4 by sputtering to form a back electrode layer. In this Ag film 5, as shown in FIG. 4C, a plurality of 80-µm wide trenches 23a were formed by laser scribing from the film surface side by using the third harmonic of a YAG laser. The formation of these trenches 23a was done by setting the laser beam power to 0.5 W, the frequency to 5 kHz, the beam diameter to 70 µm, and the relative velocity between the substrate 2 and the optical axis of the laser beam to 200 mm/sec. Also, at the same time the trenches 23a were formed in the Ag film 5, 60-µm wide trenches 23b were formed in the thin-film photovoltaic semiconductor layer 4.

After that, trenches 24 and 25 were formed to form a series array 11 in which fifty 10 mm×800 mm thin-film photovoltaic cells 10 were connected in series (parallel to the short sides of the substrate 2) to extend in the longitudinal direction. Additionally, a pair of electrode bus bars 12 were attached to the two end portions of this series array 11, thereby completing the module 1 shown in FIGS. 2 and 3.

Ten modules 1 were fabricated by the above method. The output characteristic of each module 1 was checked with a solar simulator using a xenon lamp as a light source and having an irradiance of 100 mW/cm² and an A.M. (Air Mass) of 1.5. The measurement temperature was 25° C. As a consequence, the average output of these modules 1 was found to be 30 W. Also, no damage was found on the film surface of any of these modules 1 fabricated by the above method.

In this example, scanning patterns for forming the trenches 21 to 23 were determined by taking into account the size of the substrate 2 at room temperature (25° C.), and the temperature of the substrate 2 during each scribing was also 25° C. Therefore, in this example the trenches 21 to 23 could be formed as designed.

Comparative Example

Ten modules were fabricated following the same procedures as in Example 4 except that an Ag film 5 was laser-scribed from the glass substrate side, not from the film surface side, by using the second harmonic, instead of the third harmonic, of a YAG laser. The laser scribing of this Ag film was done by setting the laser beam power to 1 W, the frequency to 10 kHz, the beam diameter to 80 µm, and the relative velocity between the substrate and the optical axis of the laser beam to 400 mm/sec. This laser scribing also formed trenches 100 µm wide in the Ag film and trenches 100 µm wide in a thin-film photovoltaic semiconductor layer 4.

The output characteristic of each module was checked under the same conditions as in Example 4. As a consequence, variations were found in the output characteristics of the modules according to this comparative example, and the average output was 27 W. Also, damage on the film surface was found in two of these modules 1 fabricated by the above method.

EXAMPLE 5

A thin-film photovoltaic module 1 shown in FIGS. 2 and 3 was fabricated by the method shown in FIGS. 4A, 4B, 6A, and 6B.

First, a structure shown in FIG. 4B was obtained following the same procedures as in Example 4. Next, as shown in FIG. 6A, a 20-nm thick Ti film 6 was formed on an Ag film 5 by sputtering.

After that, as shown in FIG. 6B, laser scribing using the second harmonic of a YAG laser was performed from the film surface side to form a plurality of 80-µm wide trenches 23 in the Ag film 5. The formation of these trenches 23 was done by setting the laser beam power to 1 W, the frequency to 10 kHz, the beam diameter to 70 µm, and the relative velocity between the substrate 2 and the optical axis of the laser beam to 200 mm/sec. Also, at the same time the trenches 23 were formed in the Ag film 5, 70-µm wide trenches 24 were formed in a thin-film photovoltaic semiconductor layer 4.

After that, trenches 24 and 25 were formed to form a series array 11 in which fifty 10 mm×800 mm thin-film photovoltaic cells 10 were connected in series (parallel to the short sides of the substrate 2) to extend in the longitudinal direction. Additionally, a pair of electrode bus bars 12 were attached to the two end portions of this series array 11, thereby completing the module 1 shown in FIGS. 2 and 3.

Ten modules 1 were fabricated by the above method. The output characteristic of each module 1 was checked under the same conditions as in Example 4. Consequently, the average output of these modules 1 was found to be 30 W. Also, no damage was found on the film surface of any of the modules 1 fabricated by the above method.

In this example, scanning patterns for forming the trenches 21 to 23 were determined by taking into account the size of the substrate 2 at room temperature (25° C.), and the temperature of the substrate 2 during each scribing was also 25° C. Therefore, in this example the trenches 21 to 23 could be formed as designed.

As has been described above, in the first embodiment of the present invention, the influence of thermal expansion and thermal shrinkage of a substrate are taken into consideration from the designing stage. Additionally, the temperature of the substrate during laser scribing is kept at a target temperature used in designing or a temperature in its neighborhood. Hence, in the first embodiment the individual trenches can be formed substantially as designed. Accordingly, it is possible to increase the output without sacrificing the fabrication yield and reduce the fabrication cost.

In the second embodiment, in addition to performing temperature control explained in the first embodiment, a single-mode laser beam and a multi-mode laser beam can be appropriately selectively used. In the second embodiment, therefore, in addition to the effects obtained in the first embodiment, it is possible to stably obtain a high-quality thin-film photovoltaic module at low fabrication cost.

In the third embodiment, in addition to performing temperature control explained in the first embodiment, the third harmonic of a YAG laser that has not been conventionally used is used in the laser scribing step. In this embodiment, therefore, not only the effects explained in the first embodiment can be obtained, but also a high-quality thin-film photovoltaic module can be stably obtained with high accuracy.

In the fourth embodiment of the present invention, in addition to performing temperature control explained in the first embodiment, laser scribing of a metal back electrode layer is performed by emitting a laser beam from the film surface side. Therefore, it is possible not only to obtain the effects explained in the first embodiment but also to obtain satisfactory module performance or improve the fabrication yield of the module.

In the fifth embodiment of the present invention, in addition to performing temperature control explained in the first embodiment, a plurality of trenches are successively formed without opening/closing a shutter whenever one trench is formed. Accordingly, in the fifth embodiment of the present invention, not only the effects explained in the first to fourth embodiments can be obtained, but also it is possible to reduce the time required for the laser scribing step and thereby improve the productivity of the module.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of fabricating a thin-film photovoltaic module, comprising the steps of:
    forming a first electrode layer on a substrate;
    dividing said first electrode layer by irradiating said first electrode layer with a laser beam in accordance with a first scanning pattern, said first scanning pattern determined by taking into account a size of said substrate at a first target temperature;
    forming a thin-film photovoltaic semiconductor layer on the divided first electrode layer;
    dividing said thin-film photovoltaic semiconductor layer by irradiating said thin-film photovoltaic semiconductor layer with a laser beam in accordance with a second scanning pattern, said second scanning pattern determined by taking account of a size of said substrate at a second target temperature;
    forming a second electrode layer on the divided thin-film photovoltaic semiconductor layer; and
    dividing said second electrode layer by irradiating said second electrode layer with a laser beam in accordance with a third scanning pattern, said third scanning pattern determined by taking account of a size of said substrate at a third target temperature,
    wherein in each of the dividing steps, irradiation with said laser beam is performed under temperature-controlled conditions such that a difference between said target temperature and the temperature of said substrate is in a range from −10° C. to +10° C.

2. The method according to claim 1, wherein in each of the dividing steps, irradiation with said laser beam is performed under temperature-controlled conditions such that said difference between said target temperature and the temperature of said substrate is in a range from −5° C. to +5° C.

3. The method according to claim 1, wherein in each of the dividing steps, irradiation with said laser beam is performed under temperature-controlled conditions such that said difference between said target temperature and the temperature of said substrate is in a range from −2° C. to +2° C.

4. The method according to claim 1, wherein said substrate is a transparent substrate, said first electrode layer is a transparent electrode layer, and said second electrode layer is a metal electrode layer.

5. The method according to claim 1, wherein said thin-film photovoltaic semiconductor layer is made from a silicon-based material.

6. The method according to claim 1, wherein said substrate is a glass substrate.

7. The method according to claim 1, wherein said first target temperature, said second target temperature, and said third target temperature are room temperature.

8. The method according to claim 1, further comprising the step of dividing said first electrode layer, said thin-film photovoltaic semiconductor layer, and said second electrode layer into a power generation region and a peripheral region surrounding said power generation region;
    wherein said first electrode layer, said thin-film photovoltaic semiconductor layer, and said second electrode layer in said power generation region form a plurality of thin-film photovoltaic cells connected in series.

9. The method according to claim 4, further comprising the step of dividing said first electrode layer, said thin-film photovoltaic semiconductor layer, and said second electrode layer into a power generation region and a peripheral region surrounding said power generation region.

10. The method according to claim 9, wherein said laser beam used in the step of dividing said first electrode layer is a multi-mode laser beam, said laser beam used in the step of dividing said thin-film photovoltaic semiconductor layer is a single-mode laser beam, and said laser beam used in the step of dividing said second electrode layer is a single-mode laser beam.

11. The method according to claim 10, wherein said first electrode layer, said thin-film photovoltaic semiconductor layer, and said second electrode layer are divided into said power generation region and said peripheral region by laser scribing using a multi-mode laser beam.

12. The method according to claim 9, wherein
    said laser beam used in the step of dividing said first electrode layer is one member selected from the group consisting of the fundamental wave, second harmonic, and third harmonic of a YAG laser;
    said laser beam used in the step of dividing said thin-film photovoltaic semiconductor layer is one member selected from the group consisting of the second and third harmonics of a YAG laser;
    said laser beam used in the step of dividing said second electrode layer is one member selected from the group consisting of the second and third harmonics of a YAG laser;
    said laser beam used in the step of dividing said first electrode layer, said thin-film photovoltaic semiconductor layer, and said second electrode layer into said power generation region and said peripheral region is one member selected from the group consisting of the second and third harmonics of a YAG laser; and one of said laser beams used in the dividing steps is the third harmonic of a YAG laser.

13. The method according to claim 9, wherein said laser beam used in the step of dividing said first electrode layer is the fundamental wave of a YAG laser;

said laser beam used in the step of dividing said thin-film photovoltaic semiconductor layer is the second harmonic of a YAG laser;

said laser beam used in the step of dividing said second electrode layer is the third harmonic of a YAG laser; and said laser beam used in the step of dividing said first electrode layer, said thin-film photovoltaic semiconductor layer, and said second electrode layer into said power generation region and said peripheral region is the third harmonic of a YAG laser.

14. The method according to claim 4, wherein said laser beam used in the step of dividing said second electrode layer has a wavelength of not more than 400 nm.

15. The method according to claim 14, wherein said laser beam used in the step of dividing said second electrode layer is the third harmonic of a solid-state laser containing yttrium.

16. The method according to claim 4, further comprising the step of forming a light-absorbing layer containing a subliming material which absorbs a laser beam having a wavelength of not more than 600 nm at a higher efficiency than that of a material forming said second electrode layer;

wherein the step of dividing said second electrode layer comprises dividing said second electrode layer by using sublimation of said subliming material occurring when said light-absorbing layer is irradiated with a laser beam having a wavelength of not more than 600 nm from the film surface side.

17. The method according to claim 16, wherein said subliming material contains at least one material selected from the group consisting of titanium, chromium, tungsten, magnesium, silicon oxide, aluminum oxide, and zinc oxide.

18. The method according to claim 16, wherein said laser beam having a wavelength of not more than 600 nm is the second harmonic of a solid-state laser.

19. The method according to claim 1, further comprising the step of dividing said first electrode layer, said thin-film photovoltaic semiconductor layer, and said second electrode layer into a power generation region and a peripheral region surrounding said power generation region, wherein at least one of the step of dividing said first electrode, the step of dividing said thin-film photovoltaic semiconductor layer, and the step of dividing said second electrode layer successively comprises:

moving said substrate in a first direction relative to the optical axis of said laser beam while said substrate is irradiated with said laser beam;

moving said substrate in a second direction crossing said first direction relative to the optical axis of said laser beam outside said power generation region; and moving said substrate in a third direction opposite to said first direction relative to the optical axis of said laser beam.

\* \* \* \* \*